United States Patent
Benker et al.

(10) Patent No.: US 10,907,095 B2
(45) Date of Patent: Feb. 2, 2021

(54) LUMINOPHORE MIXTURES FOR USE IN DYNAMIC LIGHTING SYSTEMS

(71) Applicant: LITEC-VERMOGENSVERWAL TUNGSGESELLSCHAFT MBH, Greifswald (DE)

(72) Inventors: Andreas Benker, Lautertal (DE); Ralf Petry, Griesheim (DE); Ingo Koehler, Darmstadt (DE); Irene (Yu Huan) Liu, Taipei (TW); Christof Hampel, Frankfurt am Main (DE); Aleksander Zych, Darmstadt (DE)

(73) Assignee: LITEC-VERMOGENSVERWAL TUNGSGESELLSCHAFT MBH, Greifswald (DE)

( * ) Notice: Subject to any disclaimer, the term of this patent is extended or adjusted under 35 U.S.C. 154(b) by 0 days.

(21) Appl. No.: 16/492,014

(22) PCT Filed: Mar. 5, 2018

(86) PCT No.: PCT/EP2018/055277
§ 371 (c)(1),
(2) Date: Sep. 6, 2019

(87) PCT Pub. No.: WO2018/162375
PCT Pub. Date: Sep. 13, 2018

(65) Prior Publication Data
US 2020/0010759 A1 Jan. 9, 2020

(30) Foreign Application Priority Data
Mar. 8, 2017 (EP) .................................... 17159897

(51) Int. Cl.
*C09K 11/77* (2006.01)
*H01L 27/15* (2006.01)
(Continued)

(52) U.S. Cl.
CPC ........ *C09K 11/7734* (2013.01); *H01L 27/153* (2013.01); *H01L 33/502* (2013.01); *H01L 51/5262* (2013.01); *H01S 5/0609* (2013.01)

(58) Field of Classification Search
CPC . C09K 11/7734; H01L 27/153; H01L 33/502; H01L 51/5262; H01S 5/0609
See application file for complete search history.

(56) References Cited

U.S. PATENT DOCUMENTS 7,821,196 B2 10/2010 Bokor et al.
8,829,822 B2 9/2014 Laski et al.
(Continued)

FOREIGN PATENT DOCUMENTS

DE 112011102994 T5 8/2013
DE 102013208905 A1 11/2014
(Continued)

OTHER PUBLICATIONS

International Search report in PCT/EP2018/055277 dated Aug. 30, 2018 (pp. 1-8).

Primary Examiner — Seahvosh Nikmanesh
(74) Attorney, Agent, or Firm — Mayer & Williams, PC; Stuart Mayer

(57) ABSTRACT

The present invention relates to novel phosphor mixtures and to a light-emitting device which comprises at least one of the novel phosphor mixtures. The phosphor mixtures can be used in phosphor-converted LEDs with a semiconductor that emits in the violet spectral region. The present invention furthermore relates to a lighting system which may comprise the light-emitting devices according to the invention, and to a dynamic lighting system. The present invention furthermore relates to a process for the preparation of the phosphor (Continued)

mixtures according to the invention and to the use thereof in light-emitting devices for use in general lighting and/or in specialty lighting.

20 Claims, 4 Drawing Sheets

(51) Int. Cl.
    *H01L 33/50*     (2010.01)
    *H01L 51/52*     (2006.01)
    *H01S 5/06*     (2006.01)

(56) References Cited

U.S. PATENT DOCUMENTS

| | | |
|---|---|---|
| 8,951,440 B2 | 2/2015 | Liu et al. |
| 10,125,315 B2 | 11/2018 | Zych et al. |
| 2004/0105264 A1 | 6/2004 | Spero |
| 2012/0319565 A1 | 12/2012 | Sakuta et al. |
| 2016/0108311 A1* | 4/2016 | Winkler ............... H01L 33/502 257/98 |
| 2016/0152891 A1* | 6/2016 | Petry ................... C09K 11/7721 252/301.4 F |
| 2016/0200973 A1* | 7/2016 | Winkler ............. C09K 11/0883 362/84 |
| 2018/0066186 A1 | 3/2018 | Zych et al. |
| 2018/0155621 A1* | 6/2018 | Zych .................... H01L 33/502 |
| 2018/0363858 A1* | 12/2018 | Peeters .................... G02B 6/00 |

FOREIGN PATENT DOCUMENTS

| | | |
|---|---|---|
| EP | 1886708 B1 | 10/2010 |
| EP | 1970970 B1 | 12/2016 |
| WO | 10074963 A1 | 7/2010 |
| WO | 12033750 A1 | 3/2012 |
| WO | 16150547 A1 | 9/2016 |
| WO | 16173692 A1 | 11/2016 |

\* cited by examiner

LUMINOPHORE MIXTURES FOR USE IN DYNAMIC LIGHTING SYSTEMS

SUBJECT-MATTER OF THE INVENTION

The present invention relates to novel phosphor mixtures and to a light-emitting device, in particular a light-emitting device with phosphor conversion, such as, for example, a pc-LED (phosphor conversion light emitting device), which comprises at least one novel phosphor mixture. The phosphor mixtures can be used in phosphor-converted LEDs with a semiconductor that emits in the violet spectral region. The present invention furthermore relates to a lighting system which may comprise the light-emitting devices according to the invention, and to a dynamic lighting system. The present invention additionally relates to a process for the preparation of the phosphor mixtures according to the invention and to the use thereof in light-emitting devices, in particular in light-emitting diodes (LEDs) for use in general lighting and/or in specialty lighting, for the conversion of blue, violet and/or ultraviolet radiation into light having a longer wavelength. The phosphor mixtures according to the invention are suitable, in particular, for use in dynamic lighting systems for the generation of white or coloured light spectra having particular properties, such as, for example, different levels of activation of melatonin synthesis in the human body in the case of white-light spectra or dynamic adaptation to different degrees of chlorophyll absorption in specialty lighting systems for plant cultivation.

BACKGROUND OF THE INVENTION

The greatly increasing role of LEDs in general lighting, but also in specialty lighting applications, in the meantime has hitherto been based principally on the greater energy efficiency compared with conventional lighting technologies. Besides the variability of the spectral composition through the principle of phosphor conversion, in particular for the generation of white light, further aspects, such as colour quality, in particular colour location, colour temperature and colour rendering, which can only be achieved to a very limited extent, if at all, using conventional light sources, are increasingly gaining in importance. In addition, a major advantage of LED-based lighting technology lies in the in principle unrestricted ability to combine different light sources having different spectral distributions of the emitted light in a lamp to give a light system, enabling dynamic lighting systems, which are able to change, for example, their colour temperature or other parameters coupled to the light spectrum, as a function of time, to be achieved. Examples of dynamic lighting systems of this type are shown in the laid-open patent specifications US 2004/0105264 A1, EP 1 886 708 A1, WO 2012/033750 A1 and DE 10 2013 208 905 A1.

US 2004/0105264 A1 relates to a method and apparatus comprising a multiple light-source illuminating device, the design and construction of which is derived from the lighting requirements of the specific application. The resulting illuminating device provides illumination according to the principles of correct lighting practice for the optimal performance of visual tasks in the most efficient, cost effective manner. Coupling with sensors and logical control allows illumination intensity and spectrum to be varied according to changing user needs.

EP 1 886 708 A1 presents a luminaire having a "melatonin-protecting" action which is based on a method for control of a luminaire, with which light can be generated in different spectral compositions, wherein, in the control, the spectral composition of the generated light is chosen in dependence on a preset time scheme.

WO 2012/033750 A1 relates to light-emitting diode (LED) light sources and, more particularly, to an LED-based light source having a decorative illumination function. The specification claims a light-source system comprising a plurality of light-emitting diode (LED) sources, where at least one LED source is configured to emit an associated light output in an associated one of each of a plurality of colours; and a controller configured for selectively energising said LED sources for establishing a changing pattern of said associated light outputs and a corresponding changing pattern of light emitted in said plurality of colours that is visible to an observer.

DE 10 2013 208 905 A1 describes a concept for the provision of biologically optimised light and scientific knowledge based on this concept. A corresponding lighting system and lighting method are presented with which a biologically optimised lighting situation can be established locally which is distinguished by at least one particular characteristic.

The use of LEDs as light sources in lighting systems allows the in principle unrestricted ability to combine a wide variety of base spectra together in a lamp in order to achieve light spectra which are dynamically adapted as a function of time. Owing to the laws of additive colour mixing, it is possible to connect, for example, semiconductor LEDs which emit in pure colours and do not require phosphors for light production (red-green-blue-violet) to one another in order to produce a large dynamic range of colour temperatures or other spectral properties. A disadvantage of such a configuration, due to the number of separately controllable channels, is the complexity of the control system necessary for this purpose. In the example given here, this must facilitate the appropriate combination of 4 separate light sources. Besides the control electronics necessary, it is also necessary to provide, for example, corresponding supply lines in the light system for the individual channels, which in turn can have an adverse effect on the minimum installation space necessary.

It is therefore an aim to keep the number of requisite light channels for the particular dynamic lighting application as small as possible.

The main concept used to date for light generation by means of phosphor conversion is based on a blue-emitting semiconductor diode, whose blue energy-rich light is partly absorbed in a phosphor layer which comprises fluorescent phosphors and converted into light of lower energy or longer wavelength. Phosphors which emit green, yellow, orange and/or red light are usual here. Combination of these phosphors in the correct mixing ratio with interaction with the remaining blue light that has not been absorbed gives rise to the possibility of generating light spectra which have been customised with respect to the colour location of the emitted light. The basis for this is additive colour mixing of the various light frequencies emitted by the semiconductor diode and the phosphors. By changing the mixture composition of the individual phosphors present in the phosphor layer, the colour location of the light emitted from the system as a whole can be adjusted within certain limits.

Widespread phosphor systems which emit green, yellow or orange light, such as, for example, orthosilicates $((Sr,Ba)_2SiO_4:Eu^{2+}$, cf. EP 1 970 970 A2), can still be excited sufficiently to emission not only by blue light, but also by violet light. Common red-emitting phosphors, such as, for example, nitride-based systems $((Sr,Ca)AlSiN_3:Eu^{2+}$, cf. WO 2010/074963 A1), by contrast, can also be excited by violet light and even by green light in addition to blue light.

In a generally conventional configuration, consisting of a blue-emitting semiconductor diode, a green-emitting phosphor which is excited by blue light, and a red-emitting phosphor, which may additionally also be excited by the green light from the green-emitting phosphor, this leads to the following problem: the red phosphor absorbs some of the light emitted by the green phosphor owing to said excitability in the green region of the light spectrum. A similar problem arises if a violet-emitting semiconductor diode is combined with a blue-emitting phosphor which is excited by violet light, and a green-emitting phosphor which is additionally also excited by the blue light from the blue-emitting phosphor. Here too, the green phosphor absorbs some of the blue light from the blue phosphor.

Due to this a reabsorption effect, the three primary colours which ultimately give rise to white light cannot be adjusted entirely independently of one another in the LED. In the case of the configuration with the blue semiconductor LED, an increase in the red fraction in the spectrum due to a correspondingly higher mass proportion of the red-emitting phosphor in the phosphor mixture simultaneously results in an over-proportionate reduction in the green light fraction in the resulting spectrum due to reabsorption of the green light by the red phosphor. In order to compensate for this, the mass proportion of the green phosphor must therefore be increased in order that the resultant pre-specified colour location can be retained. In the case of the configuration with the violet-emitting semiconductor LED, an increase in the green fraction in the spectrum due to a higher mass concentration of the green phosphor results in an over-proportionate reduction in the blue light fraction in the spectrum, which must be compensated by a corresponding increase in the mass proportion of blue phosphor. Due to the consequent increase in the phosphor mass concentration in the phosphor layer, however, the conversion efficiency of the phosphor layer drops in both cases described, which leads to a reduction in the radiometric radiation output and thus in lower brightness and consequently reduced overall efficiency of the phosphor-converted LED.

The currently predominantly usual use of a blue-emitting semiconductor in combination with two phosphors, usually a green-emitting phosphor and a red-emitting phosphor, gives rise to a clearly specific colour location of the light emitted by the phosphor-converted LED which is dependent only on the phosphor composition. The light emitted by the blue-emitting semiconductor here is an integral constituent of the light emitted by the phosphor-converted LED, without which a different colour location would establish itself.

Due to the spectral emission profiles of the semiconductor and the phosphors used, the overall spectral profile of the light emitted by the phosphor-converted LED is determined specifically, alongside the specific colour location. The overall spectral profile in turn determines other characteristic properties of the emitted light, such as, for example, the colour rendering index. Due to the specificity of the colour location and of the associated spectral profile, the characteristic properties coupled to the spectral profile are also specific.

With the usual configuration described here, it is therefore not possible to produce two different phosphor-converted LEDs which have both identical phosphors, identical colour locations, identical colour rendering properties and/or identical colour temperatures, but different characteristic properties coupled to the spectral emission profile.

OBJECT OF THE INVENTION

An object of the present invention is the provision of phosphor mixtures which are used in a light-emitting device, preferably a phosphor-converted LED, which is provided with a semiconductor that emits in the violet and/or ultraviolet spectral region and which improve the flexibility and overall efficiency of energy conversion (conversion efficiency) of the device. This gives rise to a higher radiometric radiation output and greater brightness of the light-emitting device.

A further object of the present invention is to provide phosphor mixtures in which the primary colours of the individual phosphors can be varied independently of one another by changing the respective mass proportions, without a change in the emitted primary colours of the other phosphors and thus a further change in the properties of the emitted light occurring when the mass proportion of one phosphor is changed, owing to the mutual influence by the respective absorption and emission behaviour of the other phosphors.

A further object of the invention consists in the provision of phosphor mixtures which enable the production of different light-emitting devices, such as preferably LEDs, which have an identical colour location, an identical colour rendering index and/or an identical correlated colour temperature, but which differ with respect to their spectral profiles and the particular properties coupled thereto.

"Identical" in the context of this application means that (1) In the case of the colour location, the value of the difference between the x colour coordinates of the colour locations of the various light-emitting devices to be compared in the CIE-1931 standard valency system (2° standard observer) is ≤0.007; this also applies to the value of the difference between the y colour coordinates (valid in the same colour system) of the colour locations to be compared;

(2) in the case of the general colour rendering index Ra (determined in accordance with CIE 13.3-1995), the relative difference between the general colour rendering indices in the comparison of the light-emitting devices is ≤7%;

(3) in the case of the correlated colour temperature (in K), the relative difference between the correlated colour temperatures in the comparison of the light-emitting devices is ≤10%;

(4) in the case of the melatonin suppression level $K_{mel,v}$ (determined in accordance with DIN SPEC 5031-100), the relative difference between the melatonin suppression levels in the comparison of the light-emitting devices is ≤5%; and (5) in the case of further parameters not explicitly mentioned here, the relative difference between these parameters in the comparison of the light-emitting devices is ≤10%, preferably ≤7%, more preferably ≤5%.

Particular properties which are coupled to the spectral profile are, for example, the proportion and intensity of individual colours or colour ranges in the spectrum. Thus, for example, light having a different blue content is used in dynamic lighting systems for "human centric lighting" applications, in which the biological effect of light on humans is at the centre of the light concept. Light having a different red content can be used, for example, in specialty lighting systems tailored to plant cultivation, which take into account different degrees of chlorophyll absorption.

An object of the present invention is to provide dynamic lighting systems of this type which are suitable, for example, for "human centric lighting" applications or for plant cultivation.

It is a further object of the present invention to provide phosphor mixtures which facilitate the production of dynamic lighting systems which are distinguished over the systems known from the prior art by less complexity in their construction.

Finally, it is an object of the present invention to provide a light-emitting device containing the phosphor mixture according to the invention, a corresponding lighting system, a process for the preparation of the phosphor mixtures according to the invention, and the use thereof in a light-emitting device for light conversion.

DESCRIPTION OF THE INVENTION

Surprisingly, it has been found that the objects described above are achieved by phosphor mixtures which comprise at least one phosphor which emits in the green spectral region of visible light and can be excited in the violet and/or ultraviolet spectral region, and comprise at least one further phosphor which either emits in the blue spectral region of visible light and can be excited in the violet and/or ultraviolet spectral region, emits in the cyan spectral region of visible light and can be excited in the blue, violet and/or ultraviolet spectral region, emits in the orange spectral region of visible light and can be excited in the blue, violet and/or ultraviolet spectral region or emits in the red spectral region of visible light and can be excited in the blue, violet and/or ultraviolet spectral region.

In addition, the inventors of the present invention have surprisingly found that the phosphor mixtures according to the invention are suitable for use as conversion material in light-emitting devices, in particular in LEDs, for applications in general and specialty lighting in which white light of one or more particular correlated colour temperatures or coloured light composed of various wavelengths is generated by combination of individual light spectra emanating from the phosphor mixtures used.

The light spectra generated may furthermore have certain properties here, depending on the application, such as, for example, in the case of white-light spectra, different levels of activation of melatonin synthesis in the human body or, for example in the case of specialty lighting systems for plant cultivation, dynamic adaptation to different degrees of chlorophyll absorption.

The objects described above are achieved, in particular, by phosphor mixtures which comprise i.) one or more compounds (i) of the formula (1) or formula (2)

$(Ba,Sr,Ca)_{2-c}M^1_cMg_{1-d}M^2_dSi_2O_{7-e-f+d}F_eCl_f$:Eu,Mn     (formula (1))

where:
$M^1$=one or more alkali-metal elements;
$M^2$=Zr and/or Hf;
$0 \le c \le 0.3$;
$0 \le d \le 0.3$;
$0 \le e \le 0.3$; and
$0 \le f \le 0.3$;

$(Ba,Sr,Ga)_{a-v-y}A_yM^1_{b-e}M^2_eM^3_vO_{c-e-y}N_{e+v}X_{x+y}$:Eu     (formula (2))

where:
A=Na and/or K;
$M^1$=B, Al, Ga, In, Tl and/or Sc;
$M^2$=Si and/or Ge;
$M^3$=Y, Lu and/or La;
X=F and/or Cl;
$0.65 \le a \le 1.0$;
$0 \le y \le 0.1 \cdot a$;
$10.667 \le b \le 11.133$;
$0 \le e \le 5.0$;
$0 \le v \le 0.1 \cdot a$;
$17.00 \le c \le 17.35$;
$0 \le x \le 5.0$;
$0.0584 \le a/b \le 0.0938$;
$0.0375 \le a/c \le 0.0588$; and
$2 \cdot a + 3 \cdot b = 2 \cdot c + x$ if $v=0$;

ii.) one or more compounds (ii), selected from the group of blue- or cyan-emitting phosphors consisting of $(Sr,Ba,Ca)_3MgSi_2O_8$:$Eu^{2+}$; $(Sr,Ba)_{10}(PO_4)_6Cl_2$:Eu; $BaMgAl_{10}O_{17}$:$Eu^{2+}$; $Sr_4Al_{14}O_{25}$:$Eu^{2+}$; $BaSi_2O_2N_2$:$Eu^{2+}$; $Lu_3(Al,Ga)_5O_{12}$:$Ce^{3+}$; $LiCaPO_4$:$Eu^{2+}$ and mixtures thereof;

and/or iii.) one or more compounds (iii), selected from the group of orange- or red-emitting phosphors consisting of $(Sr,Ba)_3SiO_5$:$Eu^{2+}$; $(1-x)(Sr,Ca)AlSiN_3 \cdot x(Si_2N_2O)$:$Eu^{2+}$ (where $0<x<1$); $(Sr,Ca)AlSiN_3$:$Eu^{2+}$; $(Ca_{1-x}Sr_x)$S:$Eu^{2+}$ (where $0 \le x \le 1$); $SrLiAl_3N_4$:$Eu^{2+}$; 3.5 MgO$\cdot$0.5 $MgF_2 \cdot GeO_2$:$Mn^{4+}$; $K_2(Si,Ti)F_6$:$Mn^{4+}$; $(Ba,Sr,Ca)_3MgSi_2O_8$:$Eu^{2+},Mn^{2+}$; $Ba_2(Lu,Y,Gd)_{1-x}Tb_x(BO_3)_2Cl$:$Eu^{2+/3+}$ (where $0 \le x \le 1$); $Ba_2Mg(BO_3)_2$:$Eu^{2+}$; $La_2O_2S$:$Eu^{3+}$; $(Sr,Ca,Ba)_2Si_5N_8$:$Eu^{2+}$; $(Sr,Ca,Ba)_2Si_{5-x}Al_xN_{8-x}O_x$:$Eu^{2+}$ (where $0 \le x \le 3.0$); $EA_dEu_cE_eN_fO_x$ (where EA=Ca, Sr and/or Ba; E=Si and/or Ge; $0.80 \le d \le 1.995$; $0.005 \le c \le 0.2$; $4.0 \le e \le 6.0$; $5.0 \le f \le 8.7$; $0 \le x \le 3.0$; and $2 \cdot d + 2 \cdot c + 4 \cdot e = 3 \cdot f + 2 \cdot x$); $A_{2-0.5y-x}Eu_xSi_5N_{8-y}O_y$ (where A=Ca, Sr and/or Ba; $0.005 \le x \le 1.0$; and $0.1 \le y \le 3.0$), in particular $(Sr,Ba)_{1.77}Eu_{0.08}Si_5N_{7.7}O_{0.3}$; $Ma_{2-y}(Ca,Sr,Ba)_{1-x-y}Si_{5-z}Me_zN_8$:$Eu_xCe_y$ (where Ma=Li, Na and/or K; Me=$Hf^{4+}$ and/or $Zr^{4+}$; $0.0015 \le x \le 0.20$; $0 \le y \le 0.15$; and $z<4.0$) and mixtures thereof;

which are characterised in that condition (A) or (B) is satisfied:

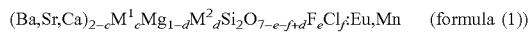

$w(i)$=≥35 to ≤95% by weight, $w(ii)$=≥0 to ≤5.0% by weight and $w(iii)$=>5.0 to ≤50% by weight;     (A)

$w(i)$=≥35 to ≤85% by weight, $w(ii)$=>5.0 to ≤65% by weight and

$w(iii)$=≥0 to ≤45% by weight;     (B)

where w(i) denotes the proportion by weight (% by weight) of compound (i), w(ii) denotes the proportion by weight (% by weight) of compound (ii) and w(iii) denotes the proportion by weight (% by weight) of compound (iii), in each case based on the total weight of the phosphor mixture;

with the proviso that phosphor mixtures comprising
31.7% by weight of $Sr_{2.5}Eu_{0.12}Ca_{0.38}MgSi_2O_8$;
63.5% by weight of $Ba_{1.9}Eu_{0.1}Mg_{0.95}Zr_{0.05}Si_2O_{7.05}$; and
4.8% by weight of $CaAlSiN_3$:Eu
are excluded.

In addition, a process is provided for the preparation of the phosphor mixture according to the invention which comprises the following steps:

a) weighing-out of a weight m(i) of phosphor (i), a weight m(ii) of phosphor (ii) and/or a weight m(iii) of phosphor (iii); and b) mixing of the weights of phosphors (i), (ii) and/or (iii) weighed out in step a).

The phosphor mixtures according to the invention can be used in a light-emitting device for the conversion of blue, violet and/or ultraviolet radiation into light of longer wavelength.

In addition, the present invention offers a light-emitting device having at least one primary light source and at least one phosphor mixture according to the invention.

Furthermore, a lighting system is claimed which comprises at least two light-emitting devices, preferably LEDs, where the at least two light-emitting devices emit light having an identical colour location and/or an identical colour rendering index and/or an identical correlated colour temperature and where the light from the at least two light-emitting devices differs from one another with respect to the spectral composition, characterised in that each of the at least two light-emitting devices comprises at least two different phosphors, where at least one of the phosphors can be excited by violet light and optionally by ultraviolet light and has a relative excitability at 450 nm of ≤65%, preferably ≤60%, further preferably ≤55%, more preferably ≤40% and most preferably ≤30%, and where the maximum excitability in the excitation spectrum corresponds to 100%.

In addition, a dynamic lighting system is claimed which comprises two of the light-emitting devices according to the invention, where the light-emitting devices emit light having an identical colour location and/or an identical colour rendering index and/or an identical correlated colour temperature, characterised in that the light from the light-emitting devices differs from one another with respect to the spectral composition.

At least one of the phosphors used in the phosphor mixtures, light-emitting devices and lighting systems is non-reabsorbable, which means that this phosphor can be excited to light emission in the violet spectral region (400 to 430 nm) and optionally in the ultraviolet spectral region (100 to 399 nm) and/or in some cases in the blue spectral region (431 to approximately 449 nm), but does not significantly absorb light in the spectral region ≥450 nm, which means that the relative excitability at 450 nm is ≤65%, preferably ≤60%, further preferably ≤55%, more preferably ≤40% and most preferably ≤30%, where the maximum excitability in the excitation spectrum corresponds to 100%. This spectral region (≥450 nm) partly encompasses blue, cyan, green, yellow, orange and red light. For this reason, the proportion by weight at least one constituent of the phosphor mixture can be varied independently of the proportions by weight of the other constituents without a change occurring in the emitted primary colours of the other phosphors and the properties of the emitted light changing further, owing to the mutual influence of the respective absorption and emission behaviour of the other phosphors. This improves the flexibility and overall efficiency of the system.

FIGS. 2 and 3 show excitation spectra of the compounds (i), which are used as non-reabsorbable phosphors in the phosphor mixtures according to the invention.

The relative excitability of a phosphor can be determined from the excitation spectrum as follows: the maximum value of the excitation spectrum is set to 100% here as reference value, all other values, which are generally lower or equal to the maximum value, are then calculated as a percentage of the maximum value and plotted correspondingly against the wavelength of the excitation light. The relative excitability of the phosphor at the wavelength considered in each case can be determined from the diagram obtained in this way.

In the context of this application, ultraviolet light denotes light whose emission maximum is between 100 and 399 nm, violet light denotes light whose emission maximum is between 400 and 430 nm, blue light denotes light whose emission maximum is between 431 and 480 nm, cyan light denotes light whose emission maximum is between 481 and 510 nm, green light denotes light whose emission maximum is between 511 and 565 nm, yellow light denotes light whose emission maximum is between 566 and 575 nm, orange light denotes light whose emission maximum is between 576 and 600 nm and red light denotes light whose emission maximum is between 601 and 750 nm.

The phosphors used as further constituents in the phosphor mixtures according to the invention can readily be excited to light emission in the violet spectral region. According to the laws of additive colour mixing, three primary colours are always necessary for unambiguous specification of a colour location. In the case of the use of a blue-emitting semiconductor in combination with two phosphors, the light from the blue semiconductor LED is one of these primary colours. On use of violet-excitable phosphors in the phosphor mixture in combination with a violet-emitting semiconductor, from which a phosphor emits in the blue spectral region, exchangeability now arises between the blue fraction of the blue-emitting phosphor and the violet fraction of the semiconductor in the resultant light from the phosphor-converted LED.

This overcomes the specificity of the colour location and thus of the spectral profile, since the short-wave primary colour in the additive colour mixture can now come either from the blue-emitting phosphor or from the violet-emitting semiconductor or be a mixture of the two components. This now makes it possible to produce different LEDs having an identical colour location, but different spectral profiles, with the same phosphors in different proportions, which consequently have different characteristics coupled to the respective spectral profile.

"Human centric lighting" as an umbrella term denotes the biological effects of light on the human body, where the person is intended to be at the centre of the light concept of general lighting. A part-aspect thereof is, for example, activation (alertness) by light. This is closely associated with the content of the hormone melatonin in the human body. Melatonin acts as synchronisation promoter for the human internal clock in order to adapt this internal clock to the light/dark rhythm of daylight. The information on the light passes through certain photoreceptors in the eye to the internal, endogenous pacemaker, which leads to suppression of melatonin synthesis in the body. Conversely, in the case of relatively low ambient light strengths or darkness, melatonin synthesis is not suppressed, as a result of which melatonin is transported into all body cells via the bloodstream and thus supplies the information for synchronisation.

Melatonin suppression has a spectral action curve, with the aid of which the level of melatonin suppression of a given light spectrum can in principle be calculated. The spectral action curve and the corresponding formulae are described in detail in DIN SPEC 5031-100 from August 2015.

The spectrum or colour temperature of natural daylight generally changes in the course of a day. At midday, with high illumination intensities, daylight has a comparatively high colour temperature, and consequently a comparatively high content in the blue region of the spectrum, whereas in twilight or at sunrise or sunset, natural light has a low colour temperature and thus a comparatively low blue content.

Investigations have shown that the blue content of light can generally suppress the secretion of melatonin to a significantly greater extent than the red content of light at the same intensity. FIG. 1 shows this dependence in greater detail. Curve "C" shows the empirically determined action spectrum for the suppression of melatonin secretion, i.e. for "melatonin suppression". The square symbols show corresponding data according to Thapan, 2001, the triangular symbols corresponding data according to Brainard, 2001. For comparison, the diagram also shows the sensitivity of the human eye for night vision (curve "V'") and daylight vision (curve "V"). A wavelength maximum for melatonin suppression in the region of about 480 nm, more precisely 464 nm according to Brainard or 468 nm according to Thapan, i.e. in the blue region of the spectrum, and a significant decrease between about 520 nm and 560 nm can be seen. Radiation having wavelengths of greater than about 560 nm accordingly has only very low potential for the suppression of melatonin secretion.

If a person is exposed to artificial light at night, there is generally a possibility of this person's melatonin secretion being adversely affected, in particular inhibited, by the artificial light, so that the release of melatonin into the blood in this person is correspondingly reduced. As a consequence, undesired effects, such as, for example, a reduction in sleep quality or even weakening of the immune system, cannot be excluded. It is to be expected that the undesired effect is more pronounced the more intense the light, since melatonin suppression increases with increasing brightness. It is furthermore to be assumed that the undesired effect is greater the longer the person is exposed to the light at night.

The above-described concept of the present invention allows light spectra which have different melatonin suppression levels with an otherwise identical correlated colour temperature and thus identical colour location by variation of the composition of the phosphor mixture in the light-emitting devices. This variation in the composition can be carried out, for example, by varying the proportion by weight of at least one constituent (phosphor) of the phosphor mixture. Corresponding LED spectra are shown in FIGS. 4 to 6.

When white-light spectra are produced by means of a blue-emitting semiconductor LED and corresponding conversion phosphors, identical colour locations generally cannot be achieved with such widely varying spectra which have a significant difference in the level of melatonin suppression, since the light from the blue semiconductor LED is in this case always an integral constituent of the entire light emitted by the phosphor-converted LED.

Dynamic lighting systems, such as, for example, "human centric lighting" systems, are able to alter the spectral profile of the light emitted from the lamps, for example depending on the time of day, in order thus to match, for example, the correlated colour temperature to natural daylight. Dynamic lighting systems having a more complex structure, as are known, for example, from Vossloh-Schwabe, are also able to vary the level of melatonin suppression of the emitted spectra, besides the correlated colour temperature, without at the same time likewise unavoidably having to vary further characteristic parameters coupled to the spectral profile, such as, for example, the general colour rendering index. This is achieved by means of a complex structure by the addition of 4 base spectra (Vossloh-Schwabe, Light+Building 2016, press kit, p. 20), which have to be combined with one another in a suitable manner. The base spectra here can consist both of monochromatic pure semiconductor LEDs and also of phosphor-converted LEDs.

A significant advantage of the lighting system according to the invention compared with similar concepts is based on the fact that a continuous shift in the level of melatonin suppression can be achieved, for example, with only 2 light channels, which each consist of a white-light spectrum and which both have a virtually identical colour location, on simple additive combination without changing the colour location. This significantly reduces the complexity of a dynamic lighting system produced therewith. Besides this advantage, mention should additionally be made of the reliability, since even if one of the light-emission channels fails, the emitted light from the remaining channel still has a usual white point and can be utilised for general lighting. A complex multichannel system which utilises, inter alia, monochromatic-emitting LEDs no longer has this advantage.

Preferred embodiments are described in the dependent claims.

DEFINITIONS

Figure 1:
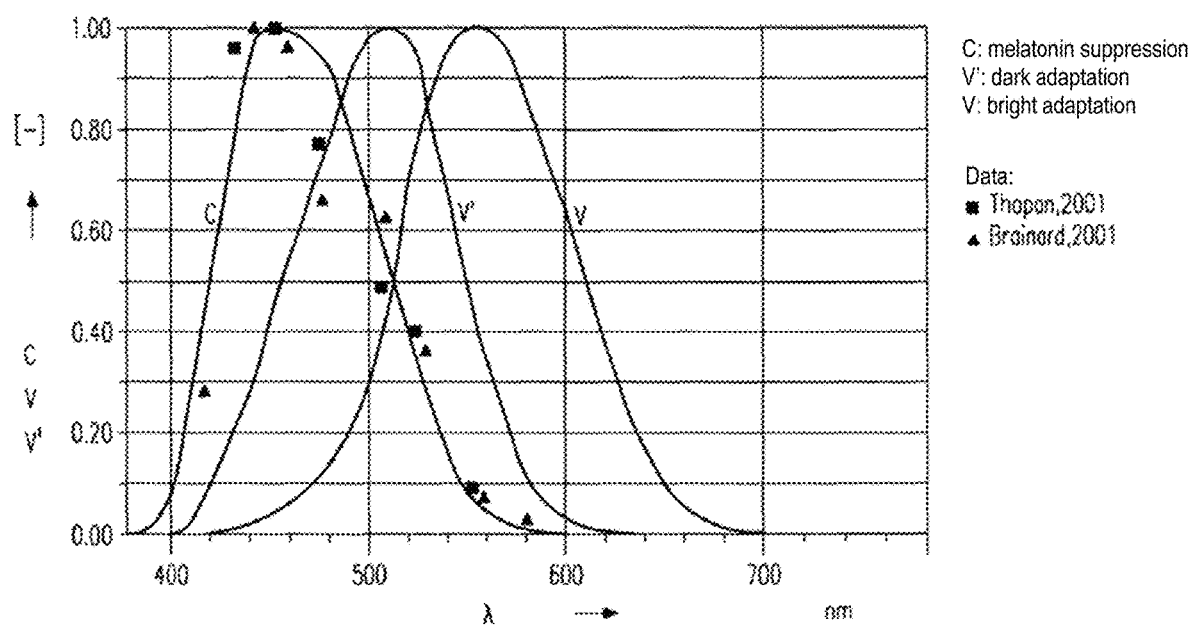
FIG. 1: Graph of the suppression of melatonin secretion as a function of the wavelength of the light hitting the retina.
Figure 2:
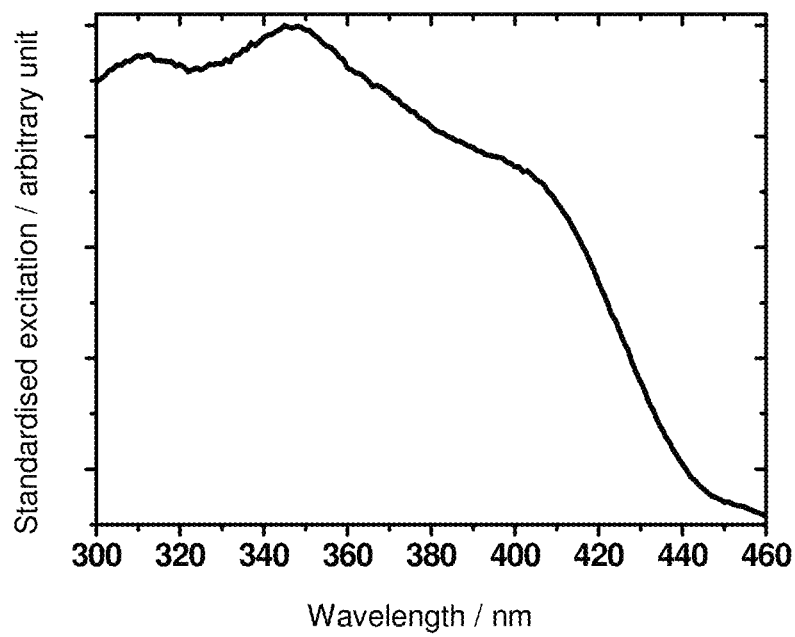
FIG. 2: Excitation spectrum of $Ba_{1.90}Eu_{0.10}Mg_{0.95}Zr_{0.05}Si_2O_{7.05}$ for emission at 517 nm.
Figure 3:
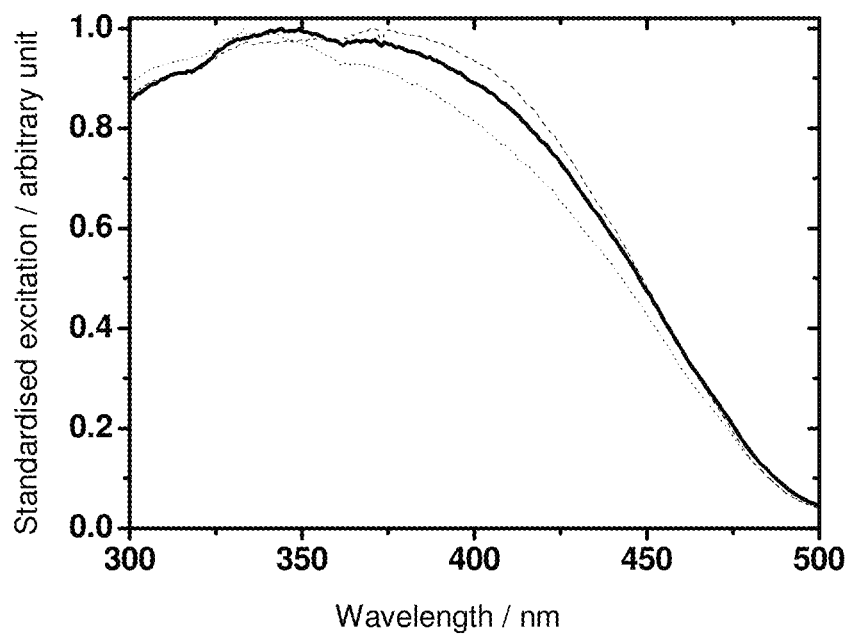
FIG. 3: Excitation spectra of $Ba_{0.63075}Eu_{0.12}Al_{11}O_{17.25}F_{0.0015}$ (continuous line), $Ba_{0.63075}Eu_{0.12}Al_{10.8}Sc_{0.2}O_{17.25}F_{0.0015}$ (dashed line) and $Ba_{0.85575}Eu_{0.12}Al_{10.85}Si_{0.15}O_{17.25}N_{0.15}F_{0.0015}$ (dotted line) for emission at 521 nm.

As used in the present application, the terms "phosphor" or "conversion phosphor", which are used as synonyms here, denote a fluorescent inorganic material in particle form having one or more emitting centres. The emitting centres are formed by activators, usually atoms or ions of a rare-earth metal element, such as, for example, La, Ce, Pr, Nd, Pm, Sm, Eu, Gd, Tb, Dy, Ho, Er, Tm, Yb and Lu, and/or atoms or ions of a transition-metal element, such as, for example, Cr, Mn, Fe, Co, Ni, Cu, Ag, Au and Zn, and/or atoms or ions of a main-group metal element, such as, for example, Na, Tl, Sn, Pb, Sb and Bi. Examples of phosphors or conversion phosphors include garnet-based phosphors, silicate-based, orthosilicate-based, thiogallate-based, sulfide-based and nitride-based phosphors. Phosphor materials in the sense of the present invention have no quantum confining effects. Non-quantum-confined phosphor materials of this type can be phosphor particles with or without silicon dioxide coating. A phosphor or conversion phosphor in the sense of the present application is taken to mean a material which absorbs radiation in a certain wavelength region of the electromagnetic spectrum, preferably in the blue, violet or ultraviolet spectral region, and emits visible light in another wavelength region of the electromagnetic spectrum, preferably in the red, orange, yellow, green, cyan or blue spectral region. The term "radiation-induced emission efficiency" should also be understood in this connection, i.e. the conversion phosphor absorbs radiation in a certain wavelength region and emits radiation in another wavelength region with a certain efficiency. The term "shift in the emission wavelength" is taken to mean that a conversion phosphor emits light at a different wavelength, i.e. shifted towards a shorter or longer wavelength, compared with another or similar conversion phosphor.

The phosphor mixture according to the invention can be in the form of a loose material, powder material, thick or thin layer material or self-supporting material in the form of a film. It may furthermore be embedded in an encapsulation material. The individual phosphors in the phosphor mixture may include supplementary materials, such as, for example, one or more coating materials.

The term "encapsulation material" relates to a light-transmitting matrix material which encapsulates the phosphor mixtures according to the invention. The light-transmitting matrix material can be a silicone, a polymer (which is formed from a liquid or semi-solid precursor material, such as a monomer), an epoxide, a glass or a hybrid of a silicone and epoxide. Specific, but non-limiting examples of polymers include fluorinated polymers, polyacrylamide polymers, polyacrylic acid polymers, polyacrylonitrile polymers, polyaniline polymers, polybenzophenone polymers, poly(methyl methacrylate) polymers, silicone polymers, aluminium polymers, polybispheno polymers, polybutadiene polymers, polydimethylsiloxane polymers, polyethylene polymers, polyisobutylene polymers, polypropylene polymers, polystyrene polymers, polyvinyl polymers, polyvinylbutyral polymers or perfluorocyclobutyl polymers. Silicones may include gels, such as, for example, Dow Corning® OE-6450, elastomers, such as, for example, Dow Corning® OE-6520, Dow Corning® OE-6550, Dow Corning® OE-6630, and resins, such as, for example, Dow Corning® OE-6635, Dow Corning® OE-6665, Nusil LS-6143 and other products from Nusil, Momentive RTV615, Momentive RTV656 and many other products from other manufacturers. Furthermore, the encapsulation material can be a (poly) silazane, such as, for example, a modified organic polysilazane (MOPS) or a perhydropolysilazane (PHPS). The content of the phosphor mixture, based on the encapsulation material, is preferably in the range from 3 to 80% by weight.

The term "coating material" denotes a material which forms a coating on the surface of a phosphor particle. The term "coating" is used here to describe one or more layers of a material which is provided on another material and partly or completely covers the outer surface or the solvent-accessible surface of the other material. The material of the coating (coating material) may penetrate at least partially into the inner structure of the phosphor which has been coated, so long as the coating as barrier still provides adequate protection against external physical influences or the passage of possibly harmful substances, such as, for example, oxygen, moisture and/or free radicals. This increases the stability of the phosphor, which leads to improved durability and service life. In addition, the coating material in some embodiments provides the phosphor with additional functionality, such as, for example, reduced sensitivity to heat, reduced light refraction or improved adhesion of the phosphor material in polymers or encapsulation materials. Furthermore, unevenness on the surface of the particles of the phosphor can be smoothed by the application of one or more coating materials. Such surface smoothing enables good processability of the phosphor and reduces undesired optical scattering effects of the emitted light at the surface of the material, which results in increased efficiency.

Suitable materials for the coating are, in particular, metal oxides and nitrides, in particular alkaline-earth metal oxides, such as $Al_2O_3$, and alkaline-earth metal nitrides, such as AlN, as well as $SiO_2$. The coating can be carried out here, for example, by fluidised-bed methods or wet-chemical methods. Suitable coating methods are known, for example, from JP 04-304290, WO 91/10715, WO 99/27033, US 2007/0298250, WO 2009/065480 and WO 2010/075908. The aim of the coating may be on the one hand higher stability of the phosphors, for example to air or moisture. However, the aim may also be improved coupling-in and out of light through a suitable choice of the surface of the coating and of the refractive indices of the coating material.

PREFERRED EMBODIMENTS OF THE INVENTION

Phosphor Mixture

The present invention relates to a phosphor mixture comprising one or more compounds (i) of the formula (1) or formula (2), one or more compounds (ii), selected from the group of blue- and cyan-emitting phosphors, and/or one or more compounds (iii), selected from the group of orange- or red-emitting phosphors, as defined in claim 1. The phosphor mixture according to the invention thus comprises one or more compounds (i) and at least one or more further compounds selected from compounds (ii) and (iii). Possible phosphor mixtures are thus phosphor mixtures which comprise one or more compounds (i) and one or more compounds (ii); phosphor mixtures which comprise one or more compounds (i) and one or more compounds (iii); and phosphor mixtures which comprise one or more compounds (i) and one or more compounds (ii) and one or more compounds (iii).

The compounds of the formula (1) are pyrosilicate phosphors, which are known from WO 2016/173692 A1. The compounds of the formula (2) are alkaline-earth metal aluminate phosphors, which are known from WO 2016/150547 A1. The disclosure content of WO 2016/173692 A1 and the disclosure content of WO 2016/150547 A1 are hereby incorporated into the present patent application by way of reference.

It goes without saying that the compounds (i) of the formula (1) or formula (2), and the corresponding preferred embodiments, are charge-neutral, i.e. the positive charges of the cationic elements of the lattice and the negative charges of the anionic elements of the lattice cancel each other out.

In a preferred embodiment, the compound (i) of the formula (1) in the phosphor mixture according to the invention is represented by the formula (3):

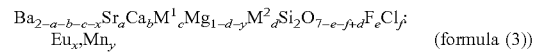

$$Ba_{2-a-b-c-x}Sr_aCa_bM^1_cMg_{1-d-y}M^2_dSi_2O_{7-e-f+d}F_eCl_f:Eu_x,Mn_y \quad \text{(formula (3))}$$

where:
$M^1$=Li, Na, K and/or Rb;
$M^2$=Zr and/or Hf;
$0 \leq a \leq 1.999$, more preferably $0 \leq a \leq 1.0$, most preferably $0 \leq a \leq 0.4$;
$0 \leq b \leq 1.999$, more preferably $0 \leq b \leq 1.0$, most preferably $0 \leq b \leq 0.4$;
$0 \leq c \leq 0.3$, more preferably $0 \leq c \leq 0.2$;
$0 \leq d \leq 0.3$, more preferably $0 \leq d \leq 0.2$;
$0 \leq e \leq 0.3$, more preferably $0 \leq e \leq 0.2$;
$0 \leq f \leq 0.3$, more preferably $0 \leq f \leq 0.2$;
$0.001 \leq x \leq 0.3$, more preferably $0.005 \leq x \leq 0.2$; and
$0 \leq y \leq 0.3$.

For compounds of the formula (3) where c≠0, which contain $M^1$, the following preferably applies to the index c: 0.001≤c≤0.3, more preferably 0.01≤c≤0.2.

For compounds of the formula (3) where d≠0, which contain $M^2$, the following preferably applies to the index d: 0.001≤d≤0.2, more preferably 0.01≤d≤0.1.

If the compound (i) of the formula (1) or (3) contains more than one of the elements Ba, Sr and Ca, the ratio of Ba, Sr and Ca can be adjusted freely within the pre-specified empirical formula. The compound (i) of the formula (1) or (3) preferably contains not more than one of the elements Ba, Sr and Ca, preferably Ba or Sr.

If the compound (i) of the formula (1) contains more than one of the elements $M^1$, the ratio of the alkali-metal elements can be adjusted freely within the pre-specified empirical formula. If the compound (i) of the formula (3) contains more than one of the elements $M^1$, the ratio of Li, Na, K and Rb can be adjusted freely within the pre-specified parameters. $M^1$ in formulae (1) and (3) is preferably Na and/or K.

If the compound (i) of the formula (1) or (3) contains more than one of the elements $M^2$, the ratio of Zr and Hf can be adjusted freely within the pre-specified empirical formula. $M^2$ in formulae (1) and (3) is preferably Zr.

If the compound (i) of the formula (1) or (3) contains more than one of the elements F and Cl, the ratio of F and Cl can be adjusted freely within the pre-specified empirical formula.

In a preferred embodiment, the preferences of the above-mentioned elements in the formula (1) or (3) apply simultaneously.

The following preferably applies in formula (3): c=0, e=0 and f=0. In formula (3), d is preferably=0. In formula (3), y is preferably=0. In formula (3), b is preferably=0. In formula (3), M is preferably=Na and/or K. These preferred embodiments can be combined with one another in any desired manner.

The compound (i) of the formula (1) or formula (3) preferably contains at least one of the elements M, Zr, F and/or Cl.

Europium in the form of divalent $Eu^{2+}$ is incorporated as dopant at the lattice site of Ba and replaces the latter.

The preferred embodiments of the elements and parameters of the formula (1) or (3) can be combined with one another in any desired manner.

The compounds of the formula (1) or (3) can be excited by ultraviolet and/or violet light, from preferably approximately 370 to approximately 430 nm, and have emission maxima in the green spectral region, from preferably approximately 510 to approximately 520 nm, depending on the precise composition.

Particularly preferred compounds (i) of the formula (3) are compounds of the formulae (3a) and (3b):

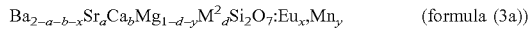

$$Ba_{2-a-b-x}Sr_aCa_bMg_{1-d-y}M^2_dSi_2O_7{:}Eu_x,Mn_y \quad \text{(formula (3a))}$$

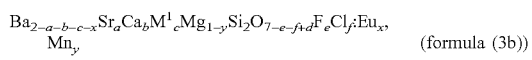

$$Ba_{2-a-b-c-x}Sr_aCa_bM^1_cMg_{1-y}Si_2O_{7-e-f+d}F_eCl_f{:}Eu_x,Mn_y \quad \text{(formula (3b))}$$

where:
$M^1$=Na and/or K;
$M^2$=Zr and/or Hf
0≤a≤1.999, more preferably 0≤a≤1.0;
0≤b≤1.999, more preferably 0≤b≤1.0;
0<c≤0.3, more preferably 0<c≤0.2;
0<d≤0.3; more preferably 0<d≤0.2;
(0<e≤0.3 and 0≤f≤0.3) or (0≤e≤0.3 and 0<f≤0.3);
0.001≤x≤0.3; and
0≤y≤0.3.

The following particularly preferably applies in formula (3a) and/or (3b): 0≤a≤0.6. The following most preferably applies in formula (3a) and/or (3b): a=0. The following particularly preferably applies in formula (3a) and/or (3b): 0≤b≤0.6. The following most preferably applies in formula (3a) and/or (3b): b=0.

Particularly preferred compounds of the formula (3) are shown in Table 1 below.

TABLE 1

Particularly preferred compounds of the formula (3).

| Compound | Empirical formula | Emission maximum [nm] |
|---|---|---|
| 1 | $Ba_{1.90}Eu_{0.10}MgSi_2O_7$ | 512 |
| 2 | $Ba_{1.85}K_{0.05}Eu_{0.10}MgSi_2O_{6.95}Cl_{0.05}$ | 518 |
| 3 | $Ba_{1.85}K_{0.05}Eu_{0.10}MgSi_2O_{6.95}F_{0.05}$ | 516 |
| 4 | $Ba_{1.90}Eu_{0.10}Mg_{0.95}Li_{0.05}Si_2O_{6.95}Cl_{0.05}$ | 513 |
| 5 | $Ba_{1.90}Eu_{0.10}Mg_{0.95}Li_{0.05}Si_2O_{6.95}F_{0.05}$ | 518 |
| 6 | $Ba_{1.90}Eu_{0.10}Mg_{0.95}Zr_{0.05}Si_2O_{7.05}$ | 516 |

In a preferred embodiment, the compound (i) of the formula (2) in the phosphor mixture according to the invention is represented by the formula (4):

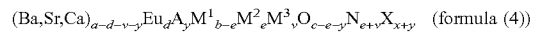

$$(Ba,Sr,Ca)_{a-d-v-y}Eu_dA_yM^1_{b-e}M^2_eM^3_vO_{c-e-y}N_{e+v}X_{x+y} \quad \text{(formula (4))}$$

where:
A=Na and/or K;
$M^1$=B, Al, Ga, In, Tl and/or Sc;
$M^2$=Si and/or Ge;
$M^3$=Y, Lu and/or La;
X=F and/or Cl;
0.65≤a≤1.0, more preferably 0.70≤a≤0.80;
0<d≤1.0, more preferably 0.03≤d≤0.25, most preferably 0.05≤d≤0.20;
0≤y≤0.1·a, more preferably 0≤y≤0.05·a, most preferably 0≤ y≤0.03·a;
10.667≤b≤11.133;
0≤e≤5.0, more preferably 0≤e≤1.0, most preferably 0≤e≤0.2;
0≤v≤0.1·a, more preferably v=0;
17.00≤c≤17.35;
0≤x≤5.0;
0.0584≤a/b≤0.0938;
0.0375≤a/c≤0.0588; and
2·a+3·b=2·c+x if v=0.

The following preferably applies in formula (4):
0.0005≤x+y≤1.0, more preferably 0.001≤x+y≤0.1, most preferably 0.001≤x+y≤0.05;
0.70≤a≤0.80;
0≤e≤0.50;
0.03≤d≤0.25;
10.93≤b≤11.067; and
17.20≤c≤17.30.

If the compound (i) of the formula (2) or (4) contains more than one of the elements Ba, Sr and Ca, the ratio of Ba, Sr and Ca can be adjusted freely within the pre-specified empirical formula. In a preferred embodiment, the compound (i) of the formula (2) or (4) contains 10 atom-% of Sr and/or Ca, more preferably ≤5 atom-% of Sr and/or Ca, and most preferably ≤3 atom-% of Sr and/or Ca, based on the total content of Ba, Sr and Ca. The compound (i) of the formula (2) or (4) preferably does not contain more than one of the elements Ba, Sr and Ca, particularly preferably Ba or Sr.

If the compound (i) of the formula (2) or (4) contains more than one of the elements A, the ratio of Na and K can be adjusted freely within the pre-specified empirical formula. A in formulae (2) and (4) is preferably K.

If the compound (i) of the formula (2) or (4) contains more than one of the elements $M^1$, the ratio of B, Al, Ga, In, Tl and Sc can be adjusted freely within the pre-specified empirical formula. In a preferred embodiment, the compound (i) of the formula (2) or (4) contains ≤10 atom-% of the elements B, Ga, In, Tl and/or Sc, more preferably ≤5 atom-% of the elements B, Ga, In, Tl and/or Sc, and most preferably ≤3 atom-% of the elements B, Ga, In, Tl and/or Sc, based on the total content of all elements $M^1$. $M^1$ in formulae (2) and (4) is preferably Al, Ga and/or Sc, more preferably Al.

If the compound (i) of the formula (2) or (4) contains more than one of the elements $M^2$, the ratio of Si and Ge can be adjusted freely within the pre-specified empirical formula. $M^2$ in formulae (2) and (4) is preferably Si. A trivalent element $M^1$ and a divalent oxide anion $O^{2-}$ are replaced by a tetravalent element $M^2$ and a trivalent nitride anion $N^{3-}$.

If the compound (i) of the formula (2) or (4) contains more than one of the elements $M^3$, the ratio of Y, Lu and La can be adjusted freely within the pre-specified empirical formula. $M^3$ in formulae (2) and (4) is preferably La. The trivalent element $M^3$ replaces an alkaline-earth metal element Ba, Sr and/or Ca. The charge is compensated by a trivalent nitride anion $N^{3-}$.

If the compound (i) of the formula (2) or (4) contains more than one of the elements X, the ratio of F and Cl can be adjusted freely within the pre-specified empirical formula. X in formulae (2) and (4) is preferably F. It is either possible for a monovalent alkali metal A and a monovalent anion X to replace an alkaline-earth metal Ba, Sr and/or Ca and a divalent oxide anion $O^{2-}$ and/or for the charge of the monovalent anion X to be compensated by a lower content of the alkaline-earth metal Ba, Sr and/or Ca and/or for some of the divalent oxide anions $O^{2-}$ to be replaced by two monovalent anions X.

In a preferred embodiment, the preferences of the above-mentioned elements in the formula (2) or (4) apply simultaneously.

The following preferably applies in formula (2) or (4): x≠0 or y≠0 or v≠0 or e≠0, if no Ca and Sr is present and $M^1$=Al.

The preferred embodiments of the elements and parameters of the formula (2) or (4) can be combined with one another in any desired manner.

The conditions indicated above for the ratio of a/b and a/c ensure that the compound is formed in the β-aluminium oxide phase and arises from a β-aluminium oxide structure of the composition $Ba_{0.75}Al_{11}O_{17.25}$, as has been demonstrated by x-ray powder diffractometry. The compounds of the formula (2) or (4) exhibit a pure $Ba_{0.75}Al_{11}O_{17.25}$ structure of β-aluminium oxide, even if they contain alkali metals A or trivalent metals $M^3$ or halide anions X or if they have been modified, for example, with $Sc^{3+}$ or other trivalent cations instead of $Al^{3+}$ or with $Si^{4+}$ and $N^{3-}$ instead of $Al^{3+}$ and $O^{2-}$. Europium in the form of divalent $Eu^{2+}$ is incorporated as dopant at the lattice site of Ba and replaces the latter.

The compounds of the formula (2) or (4) can be excited by ultraviolet and/or violet light, from preferably approximately 370 to approximately 430 nm, and have emission maxima in the green spectral region, from preferably approximately 510 to approximately 520 nm, depending on the precise composition.

Particularly preferred compounds of the formula (4) are shown in Table 2 below.

TABLE 2

Particularly preferred compounds of the formula (4).

| Compound | Empirical formula | Emission maximum [nm] |
|---|---|---|
| 1 | $Ba_{0.69075}Sr_{0.0225}Eu_{0.0375}Al_{11}O_{17.25}F_{0.0015}$ | 515 |
| 2 | $Ba_{0.69075}Ca_{0.0225}Eu_{0.0375}Al_{11}O_{17.25}F_{0.0015}$ | 511 |
| 3 | $Ba_{0.7128}Eu_{0.0375}Al_{10.7753}Ga_{0.225}O_{17.25}F_{0.0015}$ | 518 |
| 4 | $Ba_{0.7128}Eu_{0.0375}Al_{10.6253}In_{0.375}O_{17.25}F_{0.0015}$ | 516 |
| 5 | $Ba_{0.73575}Eu_{0.015}Al_{11}O_{17.25}F_{0.0015}$ | 507 |
| 6 | $Ba_{0.67575}Eu_{0.075}Al_{11}O_{17.25}F_{0.0015}$ | 518 |
| 7 | $Ba_{0.71325}Eu_{0.0375}Al_{11}O_{17.25}F_{0.0015}$ | 518 |
| 8 | $Ba_{0.63075}Eu_{0.12}Al_{11}O_{17.25}F_{0.0015}$ | 519 |
| 9 | $Ba_{0.63075}Eu_{0.12}Al_{10.8}Si_{0.15}O_{17.025}N_{0.15}F_{0.0015}$ | 521 |
| 10 | $Ba_{0.63}Eu_{0.12075}Al_{10.8}Sc_{0.2}O_{17.25}F_{0.0015}$ | 517 |
| 11 | $Ba_{0.65325}Eu_{0.075}La_{0.0225}Al_{11}O_{17.2275}N_{0.0225}F_{0.0015}$ | 516 |
| 12 | $Ba_{0.6525}Eu_{0.075}La_{0.0225}Al_{11}O_{17.2605}F_{0.0015}$ | 515 |
| 13 | $Ba_{0.69075}Eu_{0.06}Al_{10.9}Sc_{0.1}O_{17.25}F_{0.0015}$ | 515 |
| 14 | $Ba_{0.66075}Eu_{0.09}Al_{10.9}Sc_{0.1}O_{17.25}F_{0.0015}$ | 516 |
| 15 | $Ba_{0.63075}Eu_{0.12}Al_{10.9}Sc_{0.1}O_{17.25}F_{0.0015}$ | 518 |
| 16 | $Ba_{0.6075}Eu_{0.15}Al_{10.9}Sc_{0.1}O_{17.25}F_{0.0015}$ | 518 |
| 17 | $Ba_{0.57}Eu_{0.18075}Al_{10.9}Sc_{0.1}O_{17.25}F_{0.0015}$ | 515 |
| 18 | $Ba_{0.54}Eu_{0.21075}Al_{10.9}Sc_{0.1}O_{17.25}F_{0.0015}$ | 515 |
| 19 | $Ba_{0.69}Eu_{0.06075}Al_{10.8}Sc_{0.2}O_{17.25}F_{0.0015}$ | 515 |
| 20 | $Ba_{0.66075}Eu_{0.090}Al_{10.8}Sc_{0.2}O_{17.25}F_{0.0015}$ | 515 |
| 21 | $Ba_{0.63075}Eu_{0.120}Al_{10.8}Sc_{0.2}O_{17.25}F_{0.0015}$ | 519 |
| 22 | $Ba_{0.6075}Eu_{0.150}Al_{10.8}Sc_{0.2}O_{17.25}F_{0.0015}$ | 518 |
| 23 | $Ba_{0.57075}Eu_{0.180}Al_{10.8}Sc_{0.2}O_{17.25}F_{0.0015}$ | 515 |
| 24 | $Ba_{0.54075}Eu_{0.210}Al_{10.8}Sc_{0.2}O_{17.25}F_{0.0015}$ | 515 |
| 25 | $Ba_{0.63075}Eu_{0.120}Al_{10.5}Sc_{0.5}O_{17.25}F_{0.0015}$ | 516 |
| 26 | $Ba_{0.57375}Eu_{0.1629375}K_{0.028125}Al_{11}O_{17.25}F_{0.0015}$ | 516 |

In a particularly preferred embodiment, the compound (i) of the formula (4) in the phosphor mixture according to the invention is represented by the formula (4a):

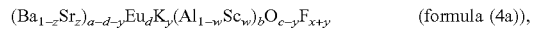

$$(Ba_{1-z}Sr_z)_{a-d-y}Eu_dK_y(Al_{1-w}Sc_w)_bO_{c-y}F_{x+y} \quad \text{(formula (4a))},$$

where:
0≤z≤0.1, more preferably 0≤z≤0.05, still more preferably 0≤z≤0.03, and most preferably z=0;
0≤w≤0.1, more preferably 0≤w≤0.05, still more preferably
0≤w≤0.03, and most preferably w=0;
where the parameters a, b, c, d, x and y have the definitions described for the formula (4).

In a particularly preferred alternative embodiment, the compound (i) of the formula (4) in the phosphor mixture according to the invention is represented by the formula (4b):

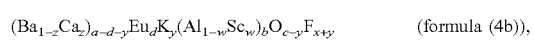

$$(Ba_{1-z}Ca_z)_{a-d-y}Eu_dK_y(Al_{1-w}Sc_w)_bO_{c-y}F_{x+y} \quad \text{(formula (4b))},$$

where:
0≤z≤0.1, more preferably 0≤z≤0.05, still more preferably 0≤z≤0.03, and most preferably z=0;
0≤w≤0.1, more preferably 0≤w≤0.05, still more preferably
0≤w≤0.03, and most preferably w=0;
where the parameters a, b, c, d, x and y have the definitions described for the formula (4).

In a very particularly preferred embodiment, the compound (i) of the formula (4) in the phosphor mixture according to the invention is represented by the formula (5):

$$Ba_{a-d-y}Eu_dK_yAl_bO_{c-y}F_{x+y} \quad \text{(formula (5))},$$

where the parameters a, b, c, d, x and y have the definitions described for the formula (4).

In a preferred embodiment of the present invention, the phosphor mixture, besides the one or more compounds (i) of the formula (1) or (2), comprises one or more compounds (ii) selected from the group of blue- and cyan-emitting phosphors, and one or more compounds (iii) selected from the group of orange- or red-emitting phosphors.

The phosphor mixture preferably comprises only in each case one compound (i) and (ii) and/or (iii).

In a particularly preferred embodiment of the present invention, the phosphor mixture consists of one or more compounds (i) of the formula (1) or (2) and one or more compounds (ii) selected from the group of blue- and cyan-emitting phosphors, and one or more compounds (iii) selected from the group of orange- or red-emitting phosphors.

In a very particularly preferred embodiment of the present invention, the phosphor mixture consists of one compound (i) of the formula (1) or (2) and one compound (ii) selected from the group of blue- and cyan-containing phosphors, and/or one compound (iii) selected from the group of orange- or red-emitting phosphors.

The compounds (ii) are selected from the group of blue- or cyan-emitting phosphors consisting of $(Sr,Ba,Ca)_3MgSi_2O_8:Eu^{2+}$; $(Sr,Ba)_{10}(PO_4)_6Cl_2:Eu$; $BaMgAl_{10}O_{17}:Eu^{2+}$; $Sr_4Al_{14}O_{25}:Eu^{2+}$; $BaSi_2O_2N_2:Eu^{2+}$; $Lu_3(Al,Ga)_5O_{12}:Ce^{3+}$; $LiCaPO_4:Eu^{2+}$ and mixtures thereof.

The compounds (iii) are selected from the group of orange- or red-emitting phosphors consisting of $(Sr,Ba)_3SiO_5:Eu^{2+}$; $(1-x)(Sr,Ca)AlSiN_3 \cdot x(Si_2N_2O):Eu^{2+}$ (where $0<x<1$), in particular $(Sr,Ca)_{0.89}Al_{0.89}Si_{1.11}N_{2.89}O_{0.11}:Eu^{2+}$; $(Sr,Ca)AlSiN_3:Eu^{2+}$; $(Ca_{1-x}Sr_x)S:Eu^{2+}$ (where $0 \leq x \leq 1$); $SrLiAl_3N_4:Eu^{2+}$; $3.5\,MgO \cdot 0.5\,MgF_2 \cdot GeO_2:Mn^{4+}$; $K_2(Si,Ti)F_6:Mn^{4+}$; $(Ba,Sr,Ca)_3MgSi_2O_8:Eu^{2+},Mn^{2+}$; $Ba_2(Lu,Y,Gd)_{1-x}Tb_x(BO_3)_2Cl:Eu^{2+/3+}$ (where $0 \leq x \leq 1$); $Ba_2Mg(BO_3)_2:Eu^{2+}$; $La_2O_2S:Eu^{3+}$; $(Sr,Ca,Ba)_2Si_5N_8:Eu^{2+}$; $(Sr,Ca,Ba)_2Si_{5-x}Al_xN_{8-x}O_x:Eu^{2+}$ (where $0 \leq x \leq 3.0$); $EA_dEu_cE_eN_fO_x$ (where EA=Ca, Sr and/or Ba; E=Si and/or Ge; $0.80 \leq d \leq 1.995$; $0.005 \leq c \leq 0.2$; $4.0 \leq e \leq 6.0$; $5.0 \leq f \leq 8.7$; $0 \leq x \leq 3.0$; and $2 \cdot d + 2 \cdot c + 4 \cdot e = 3 \cdot f + 2 \cdot x$); $A_{2-0.5y-x}Eu_xSi_5N_{8-y}O_y$ (where A=Ca, Sr and/or Ba; $0.005 \leq x \leq 1.0$; and $0.1 \leq y \leq 3.0$), in particular $(Sr,Ba)_{1.77}Eu_{0.08}Si_5N_{7.7}O_{0.3}$; $Ma_{2-y}(Ca,Sr,Ba)_{1-x-y}Si_{5-z}Me_zN_8:Eu_xCe_y$ (where Ma=Li, Na and/or K; Me=Hf$^{4+}$ and/or Zr$^{4+}$; $0.0015 \leq x \leq 0.20$; $0 \leq y \leq 0.15$; and $z < 4.0$) and mixtures thereof.

In a preferred embodiment of the present invention, conditions (A) and (B) of the phosphor mixture are defined as follows:

$w(i) = \geq 40$ to $\leq 95\%$ by weight, $w(ii) = \geq 0$ to $\leq 5.0\%$ by weight and $w(iii) = \geq 5.0$ to $\leq 50\%$ by weight; (A)

$w(i) = \geq 35$ to $\leq 85\%$ by weight, $w(ii) = > 5.0$ to $\leq 65\%$ by weight and $w(iii) = \geq 3.5$ to $\leq 45\%$ by weight. (B)

Preferred phosphor mixtures for the generation of light spectra having various melatonin suppression levels are shown in Table 3. Table 3 shows preferred phosphor mixture compositions which generate light spectra having various melatonin suppression levels in the colour temperature ranges indicated in each case on use of violet-emitting LED semiconductors as excitation light source.

TABLE 3

Preferred phosphor mixtures with associated colour temperature and melatonin suppression ranges.

| Colour temperature range | Melatonin suppression level range $K_{mel,\,v}$ according to DIN SPEC 5031-100 | Composition ranges | | | |
|---|---|---|---|---|---|
| | | P1/wt.-% | P2/wt.-% | P3/wt.-% | P4 wt.-% |
| 2500 K-<3500 K | 0-0.0005 | 70-95 | 0-5 | 0-20 | 5-30 |
| 3500 K-<4500 K | 0-0.0009 | 60-80 | 0-5 | 0-20 | 5-20 |
| 4500 K-7000 K | 0-0.001 | 35-95 | 0-5 | 0-15 | 5-15 |
| 2500 K-<3500 K | 0.0005-0.001 | 45-70 | 10-50 | 0-15 | 5-30 |
| 3500 K-<4500 K | 0.0009-0.002 | 40-80 | 5-50 | 0-10 | 0-20 |
| 4500 K-7000 K | 0.001-0.002 | 35-85 | 15-65 | 0-10 | 0-20 |

Table 4 below shows the respective individual components (phosphor components P) of the phosphor mixtures shown in Table 3.

TABLE 4

Individual components of the phosphor mixtures shown in Table 3.

| Designation of the individual component | Compound |
|---|---|
| P1 | Compounds (i) of the formulae (1), (2), (3), (3a), (3b), (4), (4a), (4b) and/or (5). |
| P2 | Compounds (ii): $(Sr,Ba,Ca)_3MgSi_2O_8:Eu^{2+}$, $(Sr,Ba)_{10}(PO_4)_6Cl_2:Eu$, $BaMgAl_{10}O_{17}:Eu^{2+}$, $Sr_4Al_{14}O_{25}:Eu^{2+}$, $BaSi_2O_2N_2:Eu^{2+}$, $Lu_3(Al,Ga)_5O_{12}:Ce^{3+}$ and/or $LiCaPO_4:Eu^{2+}$. |

TABLE 4-continued

Individual components of the phosphor mixtures shown in Table 3.

| Designation of the individual component | Compound |
|---|---|
| P3 | Compound (iii): $(Sr,Ba)_3SiO_5:Eu^{2+}$. |
| P4 | Compounds (iii): $(Sr,Ca)_{0.89}Al_{0.89}Si_{1.11}N_{2.89}O_{0.11}:Eu^{2+}$, $(Sr,Ca)AlSiN_3:Eu^{2+}$, $(Sr,Ba)_{1.77}:Eu_{0.08}Si_5N_{7.7}O_{0.3}$, $(Ca_{1-x}Sr_x)S:Eu^{2+}$ (where $0 \leq x \leq 1$), $SrLiAl_3N_4:Eu^{2+}$, 3.5 MgO•0.5 $MgF_2$•$GeO_2:Mn^{4+}$, $K_2(Si,Ti)F_6:Mn^{4+}$, $(Ba,Sr,Ca)_3MgSi_2O_8:Eu^{2+}$, $Mn^{2+}$, $Ba_2(Lu,Y,Gd)_{1-x}Tb_x(BO_3)_2Cl:Eu^{2+/3+}$ (where $0 \leq x \leq 1$), $Ba_2Mg(BO_3)_2:Eu^{2+}$, $La_2O_2S:Eu^{3+}$, $(Sr,Ca,Ba)_2Si_5N_8:Eu^{2+}$ and/or $(Sr,Ca,Ba)_2Si_{5-x}Al_xN_{8-x}O_x:Eu^{2+}$ (where $0 \leq x \leq 3.0$). |

For use in light-emitting devices, in particular in LEDs, the phosphor mixture according to the invention can be converted into any desired outer shapes, such as, for example, spherical particles, flakes and structured materials and ceramics. These shapes are summarised in accordance with the invention under the term "shaped bodies". The shaped body is preferably a "phosphor body". The present invention thus furthermore relates to a shaped body comprising the phosphors according to the invention. The production and use of corresponding shaped bodies is familiar to the person skilled in the art from numerous publications.

Besides the phosphor mixtures according to the invention, ceramics comprise matrix materials, such as, for example, silazane compounds, in particular polysilazanes or polysiloxazanes. Particularly preferred matrix materials are perhydropolysilazane (PHPS), $Al_2O_3$, $Y_3Al_5O_{12}$, $SiO_2$, $Lu_3Al_5O_{12}$, $Al_2W_3O_{12}$, $Y_2W_3O_{12}$, $YAlW_3O_{12}$, $ZrW_2O_8$, $Al_2Mo_3O_{12}$, $Y_2Mo_3O_{12}$, $YAlMo_3O_{12}$, $ZrMo_2O_8$, $Al_2WMo_2O_{12}$, $Y_2WMo_2O_{12}$, $YAlWMo_2O_{12}$, $ZrWMoO_8$, $Al_2MoW_2O_{12}$, $Y_2MoW_2O_{12}$, $YAlMoW_2O_{12}$ or mixtures thereof.

Likewise suitable matrix materials are magnesium aluminium spinel, yttrium oxide, aluminium oxynitride, zinc sulfide, zirconium oxide, yttrium lanthanum oxide, strontium chromate, magnesium oxide, beryllium oxide, yttrium oxide/zirconium dioxide, gallium arsenide, zinc selenide, magnesium fluoride, calcium fluoride, scandium oxide, lutetium oxide and gadolinium oxide.

In addition, the phosphor mixtures according to the invention may also be provided as so-called "phosphor in glass" applications (PIGs), as described, for example, in WO 2013/144777 A1.

Process for the preparation of the phosphor mixture

The process according to the invention for the preparation of a phosphor mixture, as described above, comprises the following steps:

a) weighing-out of a weight m(i) of phosphor (i), a weight m(ii) of phosphor (ii) and/or a weight m(iii) of phosphor (iii); and b) mixing of the weights of phosphors (i), (ii) and/or (iii) weighed out in step a).

The weighing-out of the weights m(i), m(ii) and/or m(iii) in step a) is preferably carried out successively. In a particular embodiment, the weighing-out may also be carried out simultaneously.

The mixing in step b) is preferably carried out with the aid of a planetary centrifugal mixer, a roller bench, an overhead mixer, a tumble mixer, a star-wheel mixer, a ball mill, a mortar mill or a fluidised-bed mixer. The mixing operation can be carried out here both in the wet state (i.e. the materials to be mixed are introduced into a suitable liquid, such as, for example, water or ethanol, before the mixing) or in the dry state.

Steps a) and b) are preferably carried out at room temperature, more preferably at 20 to 25° C.

Light-Emitting Device

The light-emitting device according to the invention comprises at least one primary light source and at least one phosphor mixture, as described above.

The primary light source is preferably either a semiconductor light-emitting diode (SLED), a semiconductor laser diode (LD) or an organic light-emitting diode (OLED). In an alternative preferred embodiment, the primary light source of the light-emitting device can be a plasma or discharge source. Preference is given to primary light sources which emit light in the spectral region from approximately 385 to approximately 480 nm, more preferably from approximately 390 to approximately 450 nm and most preferably from approximately 395 to 440 nm.

A semiconductor light-emitting diode (SLED), which forms a first group of suitable primary light sources, is a two-lead semiconductor light source. It is a p-n junction diode which emits light on activation. If a suitable voltage is applied to the supply lines, electrons are able to recombine with electron holes inside the device, causing energy to be released in the form of photons. This effect is called electroluminescence, and the colour of the light (corresponding to the energy of the photon) is determined by the energy band gap of the semiconductor. The structure and mode of functioning of an SLED are known to the person skilled in the art.

In a preferred embodiment, the primary light source is an SLED which comprises a luminescent indium aluminium gallium nitride, preferably of the formula $In_iGa_jAl_kN$ (where $0 \leq i$, $0 \leq j$, $0 \leq k$ and $i+j+k=1$), or a luminescent arrangement based on ZnO, a transparent conducting oxide (TCO), ZnSe or SiC.

A semiconductor laser diode (LD), also known as injection laser diode or ILD, is an electrically pumped semiconductor laser in which the active laser medium is formed by a p-n junction of a semiconductor diode, in a similar way to in an SLED. The structure and mode of functioning of an LD are known to the person skilled in the art. The LD is the most widespread type of a laser which is produced for manifold applications, such as, for example, glass fibre communications, barcode readers, laser pointers, CD, DVD and Blu-ray disc readers and recorders or the like, laser printers, laser scanners and increasingly directed light sources.

A third group of suitable primary light sources comprises so-called organic light-emitting diodes (OLEDs), in which the emitting electroluminescent layer is a film of an organic compound which emits light in reaction to an electric current. This layer of an organic semiconductor is located between two electrodes. Typically, at least one of these electrodes is transparent. The structure and mode of functioning of OLEDs are known to the person skilled in the art The light-emitting device is preferably a light-emitting diode (LED).

Lighting System

The lighting system according to the invention comprises at least two light-emitting devices, preferably LEDs, where the at least two light-emitting devices emit light having an identical colour location and/or an identical colour rendering index and/or an identical correlated colour temperature and where the light from the at least two light-emitting devices differs from one another with respect to the spectral composition, characterised in that each of the at least two light-emitting devices comprises at least two different phosphors, where at least one of the phosphors can be excited by violet light and optionally by ultraviolet light and has a relative excitability at 450 nm of ≤65%, preferably ≤60%, furthermore preferably ≤55%, more preferably ≤40% and most preferably ≤30%, and where the maximum excitability in the excitation spectrum corresponds to 100%.

The light from the at least two light-emitting devices differs with respect to the spectral composition if at least one parameter coupled to the spectral emission profile, such as, for example, the colour location, the colour rendering, the correlated colour temperature or the melatonin suppression, of the first light-emitting device differs from the corresponding parameter of the second light-emitting device.

"Differ" in this context means that
(1) In the case of the colour location, the value of the difference between the x colour coordinates of the colour locations of the various light-emitting devices to be compared in the CIE-1931 standard valency system (2° standard observer) is >0.007; this also applies to the value of the difference between the y colour coordinates (valid in the same colour system) of the colour locations to be compared;
(2) in the case of the general colour rendering index Ra (determined in accordance with CIE 13.3-1995), the relative difference between the general colour rendering indices in the comparison of the light-emitting devices is >7%;
(3) in the case of the correlated colour temperature (in K), the relative difference between the correlated colour temperatures in the comparison of the light-emitting devices is >10%;
(4) in the case of the melatonin suppression level $K_{mel,v}$ (determined in accordance with DIN SPEC 5031-100), the relative difference between the melatonin suppression levels in the comparison of the light-emitting devices is >5%; and
(5) in the case of further parameters not explicitly mentioned here, the relative difference between these parameters in the comparison of the light-emitting devices is >10%, preferably >7%, more preferably >5%.

In a preferred embodiment of the present invention, the at least two light-emitting devices in the lighting system are light-emitting devices according to the invention, as described above.

The lighting system of the present invention is preferably a dynamic lighting system.

The present invention furthermore relates to a dynamic lighting system which comprises at least two light-emitting devices according to the invention, where the at least two light-emitting devices according to the invention emit light having an identical colour location and/or an identical colour rendering index and/or an identical correlated colour temperature, characterised in that the light from the at least two light-emitting devices according to the invention differs from one another with respect to the spectral composition.

The light from the at least two light-emitting devices according to the invention in the dynamic lighting system differs with respect to the spectral composition if at least one parameter coupled to the spectral emission profile, such as, for example, the colour location, the colour rendering, the correlated colour temperature or the melatonin suppression, of the first light-emitting device according to the invention differs from the corresponding parameter of the second light-emitting device according to the invention, as defined above.

Use

The phosphor mixtures according to the invention can be used in a light-emitting device for the conversion of blue, violet and/or ultraviolet radiation into light having a longer wavelength.

The light-emitting device is preferably a light-emitting diode (LED) for use in general lighting and/or in specialty lighting.

The phosphor mixtures according to the invention give rise to good LED qualities even when employed in small amounts. The LED quality is described here by means of conventional parameters, such as, for example, the colour rendering index, the correlated colour temperature, the lumen equivalent or absolute lumens or the colour location in CIE x and y coordinates.

The colour rendering index (CRI) is a dimensionless lighting quantity, familiar to the person skilled in the art, which compares the colour reproduction faithfulness of an artificial light source with the colour reproduction faithfulness of pre-specified reference light sources (the reference light sources have a CRI of 100; the precise definition of the CRI is given in CIE publication 13.3-1995).

The correlated colour temperature (CCT) is a lighting quantity, familiar to the person skilled in the art, with the unit kelvin. The higher the numerical value, the higher the blue content of the light and the colder the white light from an artificial radiation source appears to the observer. The CCT follows the concept of the black body radiator, whose colour temperature describes the so-called Planck curve in the CIE diagram.

The lumen equivalent is a lighting quantity, familiar to the person skilled in the art, with the unit lm/W which describes the magnitude of the photometric luminous flux in lumens of a light source at a certain radiometric radiation power with the unit watt. The higher the lumen equivalent, the more efficient a light source.

The lumen is a photometric lighting quantity, familiar to the person skilled in the art, which describes the luminous flux of a light source, which is a mea-sure of the total visible radiation emitted by a radiation source. The greater the luminous flux, the brighter the light source appears to the observer.

CIE x and CIE y stand for the coordinates in the standard CIE colour chart (here standard observer 1931), familiar to the person skilled in the art, by means of which the colour of a light source is described.

All the parameters mentioned above can be calculated from the emission spectra of the light source using methods known to the person skilled in the art.

All variants of the invention that are described here can be combined with one another so long as the respective embodiments are not mutually exclusive. In particular, on the basis of the teaching of this specification, it is an obvious operation, as part of routine optimisation, precisely to combine various variants described here in order to arrive at a specific particularly preferred variants. The following examples are intended to illustrate the present invention and show, in particular, the result of such illustrative combinations of the described variants of the invention. However, they should in no way be regarded as limiting, but instead are intended to prompt generalisation. All compounds or components used in the preparations are either known and commercially available or can be synthesised by known methods. The temperatures indicated in the examples are always in ° C. It furthermore goes without saying that, both in the description and also in the examples, the amounts of the constituents used in the compositions always add up to a total of 100%. Percent data should always be viewed in the given context.

EXAMPLES

Examples of phosphor mixtures according to the invention

General procedure for the construction and measurement of phosphor-converted LEDs A weight $m_{P1}$ (in g) of phosphor component 1 indicated in the respective LED example is weighed out together with $m_{P2}$ (in g) of phosphor component 2 indicated in the respective LED example, with $m_{P3}$ (in g) of phosphor component 3 indicated in the respective LED example and with $m_{P4}$ (in g) of phosphor component 4 indicated in the respective LED example and mixed homogeneously in a planetary centrifugal mixer.

An optically transparent Binder (for example silicone) is subsequently added to the mixture and incorporated so that the phosphor concentration in the optically transparent Binder is expressed by Cp (in wt. %). The binder/phosphor mixture obtained in this way is applied to the chip of a violet-emitting semiconductor LED with the aid of an automatic dispenser and cured with supply of heat.

The violet-emitting semiconductor LEDs used in the present examples for LED characterisation have emission wavelengths in the range 405 nm 415 nm and are operated with a current strength of 350 mA.

The photometric characterisation of the LED is carried out using an Instrument Systems CAS 140 spectrometer and ISP 250 integration sphere connected thereto. The LED is characterised by determination of the wavelength-dependent spectral power density. The resultant spectrum of the light emitted by the LED is used to calculate the CIE x and y colour point coordinates, the correlated colour temperature (CCT) and, if necessary, the brightness or melanopic yield of visible radiation $K_{mel,v}$ in accordance with DIN SPEC 5031-100.

Table 5 shows LED Examples 1 and 2 of an LED emitting cold-white light with non-reabsorbable blue and green phosphors or a reabsorbable green phosphor.

TABLE 5

LED Examples 1 and 2 with phosphor mixtures comprising non-reabsorbable or reabsorbable phosphor mixture components.

|  | LED Example 1<br>LED emitting<br>cold-white light<br>with non-reabsorbable<br>blue and green phosphors | LED Example 2<br>LED emitting<br>cold-white light<br>with reabsorbable<br>green phosphor |
|---|---|---|
| P1 | Green-emitting phosphor in accordance with compound (i) of the composition $Ba_{2-x}Eu_xMg_{1-y-z}Zr_yMn_zSi_2O_{7+y}$ where $0.001 \leq x \leq 0.3$; $0.01 \leq y \leq 0.3$; and $0 \leq z \leq 0.3$ | Green-emitting phosphor in accordance with compound (i) of the composition $Si_{6-z}Al_zO_zN_{8-z}:Eu^{2+}$ where $0 < z < 4.2$ |
| P2 | Blue-emitting phosphor in accordance with compound (ii) of the composition $(Sr,Ba,Ca)_3MgSi_2O_8:Eu^{2+}$ | Blue-emitting phosphor in accordance with compound (ii) of the composition $(Sr,Ba,Ca)_3MgSi_2O_8:Eu^{2+}$ |
| P3 | — | — |
| P4 | Red-emitting phosphor in accordance with compound (iii) of the composition $(Sr,Ca)_{0.89}Al_{0.89}Si_{1.11}N_{2.89}O_{0.11}:Eu^{2+}$ | Red-emitting phosphor in accordance with compound (iii) of the composition $(Sr,Ca)_{0.89}Al_{0.89}Si_{1.11}N_{2.89}O_{0.11}:Eu^{2+}$ |
| $m_{P1}/g$: | 0.9787 | 0.1885 |
| $m_{P2}/g$: | 0.9213 | 1.4231 |
| $m_{P3}/g$: | — | — |

TABLE 5-continued

LED Examples 1 and 2 with phosphor mixtures comprising non-reabsorbable or reabsorbable phosphor mixture components.

|  | LED Example 1<br>LED emitting<br>cold-white light<br>with non-reabsorbable<br>blue and green phosphors | LED Example 2<br>LED emitting<br>cold-white light<br>with reabsorbable<br>green phosphor |
|---|---|---|
| $m_{P4}$/g: | 0.4000 | 0.4884 |
| $c_P$/wt.-%: | 23 | 21 |
| CIE (1931) x: | 0.376 | 0.376 |
| CIE (1931) y: | 0.374 | 0.375 |
| CCT/K: | 5058 | 4907 |
| Brightness/lm | 55 | 51 |

Figure 4:
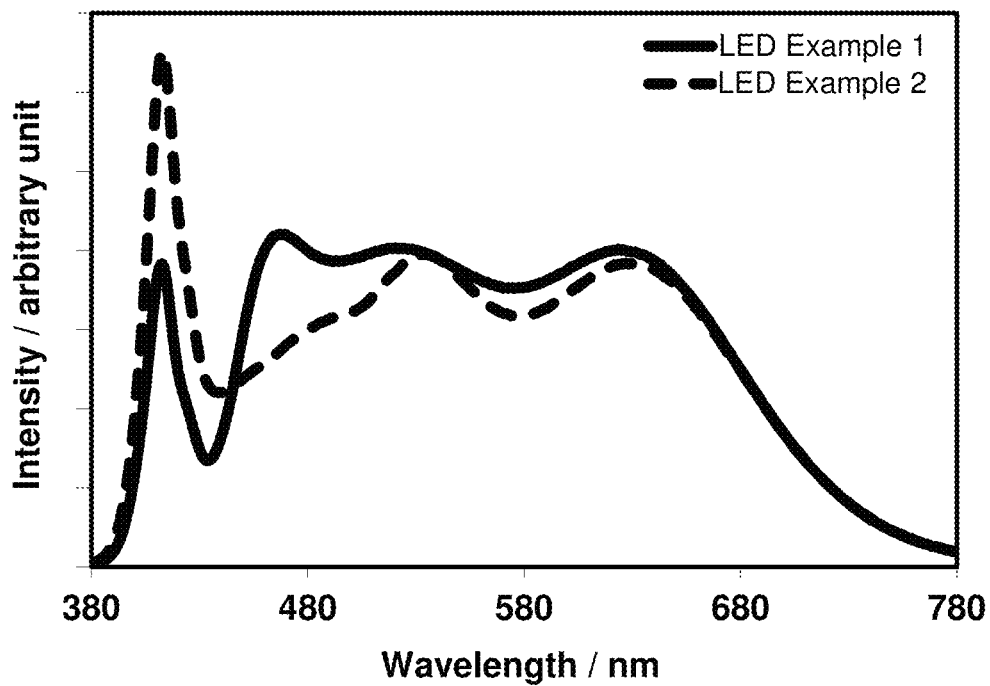
FIG. 4: Light emission spectra of LED Examples 1 and 2.

LED Examples 1 and 2 show a non-reabsorbable system compared with a reabsorbable system, for which the improvement in the overall efficiency can be demonstrated. FIG. 4 shows the light emission spectra of LED Examples 1 and 2.

Table 6 shows LED Examples 3 and 4 of an LED emitting neutral-white light having a low melatonin suppression level and a high melatonin suppression level respectively.

TABLE 6

LED Examples 3 and 4 with phosphor mixtures having a high and low melatonin suppression level respectively.

|  | LED Example 3<br>LED emitting<br>neutral-white<br>light having a<br>low melatonin<br>suppression level | LED Example 4<br>LED emitting<br>neutral-white<br>light having a<br>high melatonin<br>suppression level |
|---|---|---|
| P1 | Green-emitting phosphor in accordance with compound (i) of the composition $Ba_{2-x}Eu_xMg_{1-y-z}Zr_yMn_zSi_2O_{7+y}$ where $0.001 \leq x \leq 0.3$; $0.01 \leq y \leq 0.3$; and $0 \leq z \leq 0.3$ | Green-emitting phosphor in accordance with compound (i) of the composition $Ba_{2-x}Eu_xMg_{1-y-z}Zr_yMn_zSi_2O_{7+y}$ where $0.001 \leq x \leq 0.3$; $0.01 \leq y \leq 0.3$; and $0 \leq z \leq 0.3$ |
| P2 | — | Blue-emitting phosphor in accordance with compound (ii) of the composition $(Sr,Ba,Ca)_3MgSi_2O_8:Eu^{2+}$ |
| P3 | Orange-emitting phosphor in accordance with compound (iii) of the composition $(Sr,Ba)_3SiO_5:Eu^{2+}$ | Orange-emitting phosphor in accordance with compound (iii) of the composition $(Sr,Ba)_3SiO_5:Eu^{2+}$ |
| P4 | Red-emitting phosphor in accordance with compound (iii) of the composition $(Sr,Ca)AlSiN_3:Eu^{2+}$ | Red-emitting phosphor in accordance with compound (iii) of the composition $(Sr,Ca)AlSiN_3:Eu^{2+}$ |
| $m_{P1}$/g: | 1.2944 | 2.3108 |
| $m_{P2}$/g: | — | 1.6159 |
| $m_{P3}$/g: | 0.2367 | 0.2081 |
| $m_{P4}$/g: | 0.2689 | 0.3651 |
| $c_P$/wt.-%: | 18 | 45 |
| CIE (1931) x: | 0.376 | 0.376 |
| CIE (1931) y: | 0.374 | 0.375 |
| CCT/K: | 4113 | 4113 |
| $K_{mel}$, v | 0.0008 | 0.0010 |

Figure 5:
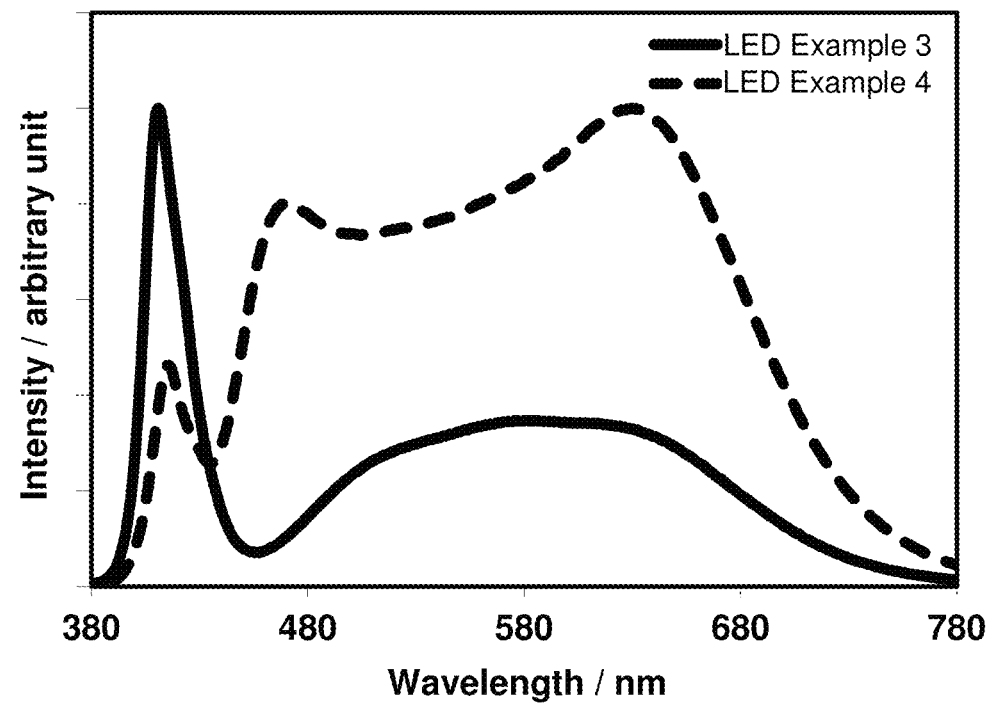
FIG. 5: Light emission spectra of LED Examples 3 and 4.

LED Examples 3 and 4 show two LED spectra which, with a virtually identical colour location, have different melatonin suppression levels and which can therefore be combined with one another in the manner described here in a 2-channel lighting system. FIG. 5 shows the light emission spectra of LED Examples 3 and 4.

Table 7 shows LED Examples 5 and 6 of an LED emitting neutral-white light having a low melatonin suppression level and a high melatonin suppression level respectively.

TABLE 7

LED Example 5 and 6 with phosphor mixtures having a high and low melatonin suppression level respectively.

|  | LED Example 5 LED emitting neutral-white light having a low melatonin suppression level | LED Example 6 LED emitting neutral-white light having a high melatonin suppression level |
|---|---|---|
| P1 | Green-emitting phosphor in accordance with compound (i) of the composition $Ba_{0.63075}Eu_{0.12}Al_{11}O_{17.25} \cdot F_{0.0015}$ (cf. Table 2, compound 8) | Green-emitting phosphor in accordance with compound (i) of the composition $Ba_{0.63075}Eu_{0.12}Al_{11}O_{17.25} \cdot F_{0.0015}$ (cf. Table 2, compound 8) |
| P2 | — | Blue-emitting phosphor in accordance with compound (ii) of the composition $(Sr,Ba,Ca)_3MgSi_2O_8:Eu^{2+}$ |
| P3 | Orange-emitting phosphor in accordance with compound (iii) of the composition $(Sr,Ba)_3SiO_5:Eu^{2+}$ | Orange-emitting phosphor in accordance with compound (iii) of the composition $(Sr,Ba)_3SiO_5:Eu^{2+}$ |
| P4 | Red-emitting phosphor in accordance with compound (iii) of the composition $(Sr,Ca)AlSiN_3:Eu^{2+}$ | Red-emitting phosphor in accordance with compound (iii) of the composition $(Sr,Ca)AlSiN_3:Eu^{2+}$ |
| $m_{P1}/g$: | 2.7778 | 4.5212 |
| $m_{P2}/g$: | — | 0.9585 |
| $m_{P3}/g$: | 0.0370 | 0.0801 |
| $m_{P4}/g$: | 0.1852 | 0.1602 |
| $c_P$/wt.-%: | 30 | 57 |
| CIE (1931) x: | 0.376 | 0.381 |
| CIE (1931) y: | 0.374 | 0.371 |
| CCT/K: | 4113 | 3947 |
| $K_{mel}$, v | 0.0009 | 0.0010 |

Figure 6:
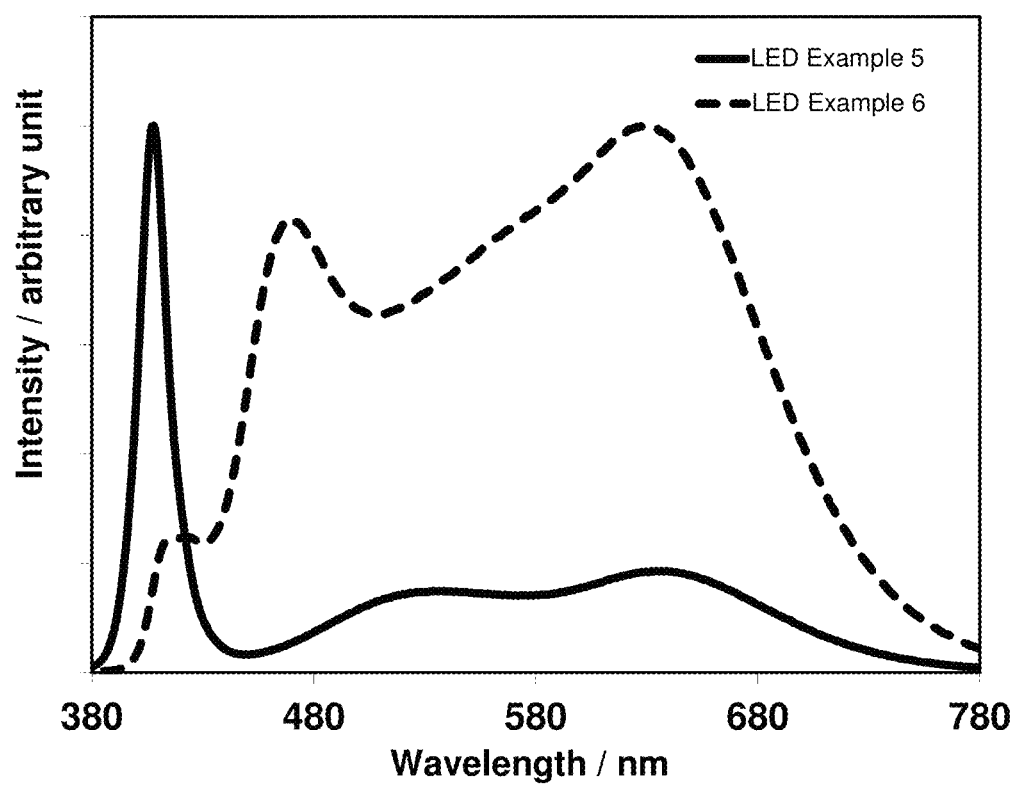
FIG. 6: Light emission spectra of LED Examples 5 and 6.

LED Examples 5 and 6 show two LED spectra which, with a virtually identical colour location, have different melatonin suppression levels and which can therefore be combined with one another in the manner described here in a 2-channel lighting system. FIG. 6 shows the light emission spectra of LED Examples 5 and 6.

The invention claimed is:

1. Phosphor mixture comprising:
i.) one or more compounds (i) of the formula (1) or formula (2)

$(Ba,Sr,Ca)_{2-c}M^1_cMg_{1-d}M^2_dSi_2O_{7-e-f+d}F_eCl_f:Eu,Mn$ (formula (1))

where:
$M^1$ = one or more alkali-metal elements;
$M^2$ = Zr and/or Hf;
$0 \leq c \leq 0.3$;
$0 \leq d \leq 0.3$;
$0 \leq e \leq 0.3$; and
$0 \leq f \leq 0.3$;

$(Ba,Sr,Ga)_{a-v-y}A_yM^1_{b-e}M^2_eM^3_vO_{c-e-y}N_{e+v}X_{x+y}:Eu$ (formula (2))

where:
A = Na and/or K;
$M^1$ = B, Al, Ga, In, Tl and/or Sc;

$M^2$ = Si and/or Ge;
$M^3$ = Y, Lu and/or La;
X = F and/or Cl;
$0.65 \leq a \leq 1.0$;
$0 \leq y \leq 0.1 \cdot a$;
$10.667 \leq b \leq 11.133$;
$0 \leq e \leq 5.0$;
$0 \leq v \leq 0.1 \cdot a$;
$17.00 \leq c \leq 17.35$;
$0 \leq x \leq 5.0$;
$0.0584 \leq a/b \leq 0.0938$;
$0.0375 \leq a/c \leq 0.0588$; and
$2 \cdot a + 3 \cdot b = 2 \cdot c + x$ if $v = 0$;

ii.) one or more compounds (ii), selected from the group of blue- or cyan-emitting phosphors consisting of $(Sr,Ba,Ca)_3MgSi_2O_8:Eu^{2+}$; $(Sr,Ba)_{10}(PO_4)_6Cl_2:Eu$; $BaMgAl_{10}O_{17}:Eu^{2+}$; $Sr_4Al_{14}O_{25}:Eu^{2+}$; $BaSi_2O_2N_2:Eu^{2+}$; $Lu_3(Al,Ga)_5O_{12}:Ce^{3+}$; $LiCaPO_4:Eu^{2+}$ and mixtures thereof;

and/or iii.) one or more compounds (iii), selected from the group of orange- or red-emitting phosphors consisting of $(Sr,Ba)_3SiO_5:Eu^{2+}$; $(1-x)(Sr,Ca)AlSiN_3.x(Si_2N_2O):Eu^{2+}$ (where $0<x<1$); $(Sr,Ca)AlSiN_3:Eu^{2+}$; $(Ca_{1-x}Sr_x)S:Eu^{2+}$ (where $0\leq x\leq 1$); $SrLiAl_3N_4:Eu^{2+}$; 3.5 $MgO.0.5$ $MgF_2.GeO_2:Mn^{4+}$; $K_2(Si,Ti)F_6:Mn^{4+}$; $(Ba,Sr,Ca)_3MgSi_2O_8:Eu^{2+},Mn^{2+}$; $Ba_2(Lu,Y,Gd)_{1-x}Tb_x(BO_3)_2Cl:Eu^{2+/3+}$ (where $0\leq x\leq 1$); $Ba_2Mg(BO_3)_2:Eu^{2+}$; $La_2O_2S:Eu^{3+}$; $(Sr,Ca,Ba)_2Si_5N_8:Eu^{2+}$; $(Sr,Ca,Ba)_2Si_{5-x}Al_xN_{8-x}O_x:Eu^{2+}$ (where $0\leq x\leq 3.0$); $EA_dEu_eE_fN_fO_x$ (where EA = Ca, Sr and/or Ba; E = Si and/or Ge; $0.80\leq d\leq 1.995$; $0.005\leq c\leq 0.2$; $4.0\leq e\leq 6.0$; $5.0\leq f\leq 8.7$; $0\leq x\leq 3.0$; and $2\cdot d+2\cdot c+4\cdot e=3\cdot f+2\cdot x$);

$A_{2-0.5y-x}Eu_xSi_5N_{8-y}O_y$, (where A=Ca, Sr and/or Ba; 0.005≤x≤1.0; and 0.1≤y≤3.0); $Ma_{2-y}(Ca,Sr,Ba)_{1-x-y}Si_{5-z}Me_zN_8:Eu_xCe_y$, (where Ma=Li, Na and/or K; Me=$Hf^{4+}$ and/or $Zr^{4+}$; 0.0015≤x≤0.20; 0≤y≤0.15; and z<4.0) and mixtures thereof;

characterised in that condition (A) or (B) is satisfied:

w(i)=≥35 to ≤95% by weight, w(ii)=≥0 to ≤5.0% by weight and w(iii)=>5.0 to ≤50% by weight;  (A)

w(i)=≥35 to ≤85% by weight, w(ii)=≥5.0 to ≤65% by weight and w(iii)=≥0 to ≤45% by weight;  (B)

where w(i) denotes the proportion by weight (% by weight) of compound (i), w(ii) denotes the proportion by weight (% by weight) of compound (ii) and w(iii) denotes the proportion by weight (% by weight) of compound (iii), in each case based on the total weight of the phosphor mixture;

with the proviso that phosphor mixtures comprising
31.7% by weight of $Sr_{2.5}Eu_{0.12}Ca_{0.38}MgSi_2O_8$;
63.5% by weight of $Ba_{1.9}Eu_{0.1}Mg_{0.95}Zr_{0.05}Si_2O_{7.05}$; and
4.8% by weight of $CaAlSiN_3:Eu$
are excluded.

2. Phosphor mixture according to claim 1, characterised in that the compounds (i) of the formula (1) are represented by the formula (3):

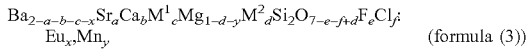
$Ba_{2-a-b-c-x}Sr_aCa_bM^1_cMg_{1-d-y}M^2_dSi_2O_{7-e-f+d}F_eCl_f:Eu_x,Mn_y)$  (formula (3))

where:
$M^1$=Li, Na, K and/or Rb;
$M^2$=Zr and/or Hf;
0≤a≤1.999;
0≤b≤1.999;
0≤c≤0.3;
0≤d≤0.3;
0≤e≤0.3;
0≤f≤0.3;
0.001≤x≤0.3; and
0≤y≤0.3.

3. Phosphor mixture according to claim 2, characterised in that, in formula (3), c=0, e=0 and f=0.

4. Phosphor mixture according to claim 2, characterised in that, in formula (3), d is =0.

5. Phosphor mixture according to claim 2, characterised in that, in formula (3), y is =0.

6. Phosphor mixture according to claim 2, characterised in that, in formula (3), b is =0.

7. Phosphor mixture according to claim 1, characterised in that the compounds (i) of the formula (2) are represented by the formula (4):

$(Ba,Sr,Ca)_{a-d-v-y}Eu_dA_yM^1_{b-e}M^2_eM^3_vO_{c-e-y}N_{e+v}X_{x+y}$  (formula (4))

where:
A=Na and/or K;
$M^1$=B, Al, Ga, In, Tl and/or Sc;
$M^2$=Si and/or Ge;
$M^3$=Y, Lu and/or La;
X=F and/or Cl;
0.65≤a≤1.0;
0≤d≤1.0;

0≤y≤0.1·a;
10.667≤b≤11.133;
0≤e≤5.0;
0≤v≤0.1·a;
17.00≤c≤17.35;
0≤x≤5.0;
0.0584≤a/b≤0.0938;
0.0375≤a/c≤0.0588; and
2·a+3·b=2·c+x if v=0.

8. Phosphor mixture according to claim 7, characterised in that the following applies in formula (4):
0.0005≤x+y≤1.0, preferably 0.001≤x+y≤0.1, more preferably 0.001≤x+y≤0.05;
0.70≤a≤0.80;
0≤e≤0.5;
0.03≤d≤0.25;
10.93≤b≤11.067; and
17.20≤c≤17.30.

9. Phosphor mixture according to claim 1, characterised in that it comprises one or more compounds (ii) and one or more compounds (iii).

10. Phosphor mixture according to claim 1, characterised in that conditions (A) and (B) are defined as follows:

w(i)=≥40 to ≤95% by weight, w(ii)=≥0 to ≤5.0% by weight and w(iii)=>5.0 to ≤50% by weight;  (A)

w(i)=≥35 to ≤85% by weight, w(ii)=≥5.0 to ≤65% by weight and w(iii)=≥3.5 to ≤45% by weight.  (B)

11. Process for the preparation of a phosphor mixture according to claim 1, comprising the steps:
a) weighing-out of a weight m(i) of phosphor (i), a weight m(ii) of phosphor (ii) and/or a weight m(iii) of phosphor (iii); and
b) mixing of the weights of phosphors (i), (ii) and/or (iii) weighed out in step a).

12. Light-emitting device which comprises at least one primary light source and at least one phosphor mixture according to claim 1.

13. Light-emitting device according to claim 12, characterised in that the primary source is a light-emitting semiconductor diode (SLED), a semiconductor laser diode (LD), an organic light-emitting diode (OLED) or a plasma or discharge source.

14. Lighting system comprising at least two light-emitting devices, where the at least two light-emitting devices emit light having an identical colour location and/or an identical colour rendering index and/or an identical correlated colour temperature and where the light from the at least two light-emitting devices differs from one another with respect to the spectral composition, characterised in that each of the at least two light-emitting devices comprises at least two different phosphors, where at least one of the phosphors can be excited by violet light and optionally by ultraviolet light and has a relative excitability at 450 nm of ≤65% and where the maximum excitability in the excitation spectrum corresponds to 100%.

15. Lighting system comprising at least two light-emitting devices, where the at least two light-emitting devices emit light having an identical colour location and/or an identical colour rendering index and/or an identical correlated colour temperature and where the light from the at least two light-emitting devices differs from one another with respect to the spectral composition, characterised in that each of the at least two light-emitting devices comprises at least two different phosphors, where at least one of the phosphors can be excited by violet light and optionally by ultraviolet light and has a relative excitability at 450 nm of ≤65% and where the maximum excitability in the excitation spectrum corresponds to 100%, where the at least two light-emitting devices are light-emitting devices according to claim 12.

16. Lighting system according to claim 14, characterised in that it is a dynamic lighting system.

17. Dynamic lighting system which comprises at least two light emitting devices according to claim 12, where the at least two light-emitting devices emit light having an identical colour location and/or an identical colour rendering index and/or an identical correlated colour temperature, characterised in that the light from the at least two light-emitting devices differs from one another with respect to the spectral composition.

18. A process for the conversion of blue, violet and/or ultraviolet radiation into light having a longer wavelength, comprising subjecting said radiation to a light-emitting device comprising a phosphor mixture according to claim 1.

19. The process according to claim 18, where the light-emitting device is a light-emitting diode (LED) for use in general lighting and/or in specialty lighting.

20. Lighting system comprising at least two light-emitting devices, where the at least two light-emitting devices emit light having an identical colour location and/or identical colour rendering index and/or an identical correlated colour temperature and where the light from the at least two light-emitting devices differs from one another with respect to the spectral composition, characterised in that each of the at least two light-emitting devices comprises at least two different phosphors, where at least one of the phosphors can be excited by violet light and optionally by ultraviolet light and has a relative excitability at 450 nm of ≤65% and where the maximum excitability in the excitation spectrum corresponds to 100%, where the at least two light-emitting devices are light-emitting devices according to claim 13.

* * * * *